(12) United States Patent
Lee

(10) Patent No.: US 7,498,822 B2
(45) Date of Patent: Mar. 3, 2009

(54) LINEAR CAPACITANCE MEASUREMENT AND TOUCHLESS SWITCH

(76) Inventor: Ying Lau Lee, 32/F., Siu on Centre, 188 Lockhart Road, Wanchai, Hong Kong (CN)

( * ) Notice: Subject to any disclaimer, the term of this patent is extended or adjusted under 35 U.S.C. 154(b) by 226 days.

(21) Appl. No.: 11/654,495

(22) Filed: Jan. 17, 2007

(65) Prior Publication Data

US 2007/0164756 A1 Jul. 19, 2007

Related U.S. Application Data

(63) Continuation-in-part of application No. 11/202,486, filed on Aug. 12, 2005, now Pat. No. 7,323,886.

(60) Provisional application No. 60/690,486, filed on Jun. 15, 2005, provisional application No. 60/662,378, filed on Mar. 17, 2005, provisional application No. 60/619,697, filed on Oct. 19, 2004, provisional application No. 60/601,610, filed on Aug. 16, 2004.

(51) Int. Cl.
*G01R 27/26* (2006.01)

(52) U.S. Cl. .................. 324/662; 324/658; 324/679

(58) Field of Classification Search .......... 324/658, 324/662, 679, 519
See application file for complete search history.

(56) References Cited

U.S. PATENT DOCUMENTS

| | | | |
|---|---|---|---|
| 3,909,625 A | 9/1975 | Colglazier et al. | 307/116 |
| 4,030,037 A | 6/1977 | Tanaka et al. | 328/5 |
| 4,550,221 A | 10/1985 | Mabusth | 178/18 |
| 4,871,976 A | 10/1989 | Watanabe et al. | 330/69 |
| 4,943,889 A | 7/1990 | Ohmatoi | 361/284 |
| 5,063,306 A | 11/1991 | Edwards | 307/308 |
| 5,442,347 A | 8/1995 | Vranish | 340/870.37 |
| 5,594,222 A | 1/1997 | Caldwell | 200/600 |
| 5,633,594 A | 5/1997 | Okada | 324/679 |
| 5,726,579 A | 3/1998 | Masuda | 324/679 |
| 5,757,196 A | 5/1998 | Wetzel | |
| 5,812,057 A | 9/1998 | Hepworth et al. | 340/540 |
| 5,986,497 A | 11/1999 | Tsugai | |
| 6,310,611 B1 | 10/2001 | Caldwell | 345/173 |
| 6,366,099 B1 | 4/2002 | Reddi | 324/678 |

(Continued)

FOREIGN PATENT DOCUMENTS

EP  1 083 409 A3  7/2002

(Continued)

*Primary Examiner*—Vincent Q Nguyen
(74) *Attorney, Agent, or Firm*—Weingarten, Schurgin, Gagnebin & Lebovici LLP

(57) ABSTRACT

Capacitance measurement apparatus that enhances the sensitivity and accuracy of capacitive transducers, proximity sensors, and touchless switches. Each of two capacitors (C1, C2) under measurement has one end connected to ground and is kept at substantially the same voltage potential by operational amplifier (A1) or amplifiers (A0, A1) using negative feedback. The apparatus is driven by a periodic e.g. sinusoidal signal source (G1) or sources (G1, G2) and includes a difference amplifier (A2) operative to produce an electrical signal having a linear relationship with a specified arithmetic function of the capacitances of the two capacitors (C1, C2). A touchless switch is implemented using the capacitance measurement apparatus. The touchless switch includes two sensor electrodes (E1, E2) that correspond to the two capacitors (C1, C2) under measurement and in one embodiment has a front surface in the form of a container.

4 Claims, 15 Drawing Sheets

U.S. PATENT DOCUMENTS

| | | | |
|---|---|---|---|
| 6,456,477 B1 | 9/2002 | McIntosh et al. | 361/115 |
| 6,462,562 B1 | 10/2002 | Svoboda et al. | 324/663 |
| 6,501,282 B1 | 12/2002 | Dummermuth et al. | |
| 6,744,258 B2 | 6/2004 | Ishio et al. | |
| 6,842,018 B2 | 1/2005 | McIntosh | |
| 6,922,063 B2 | 7/2005 | Heger | |
| 7,071,709 B2 | 7/2006 | Itakura et al. | |

FOREIGN PATENT DOCUMENTS

| | | |
|---|---|---|
| GB | 2 167 195 A | 5/1986 |
| JP | 9-0280806 | 10/1997 |
| JP | 11-067030 | 3/1999 |

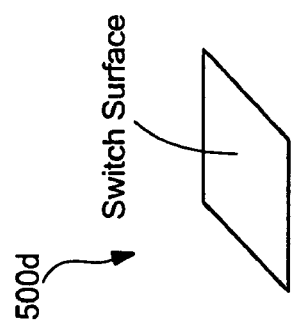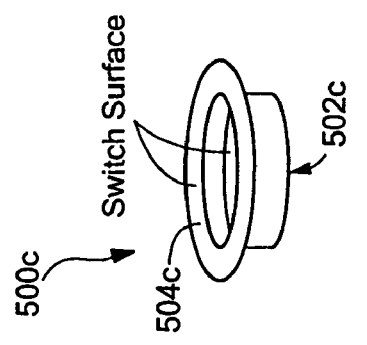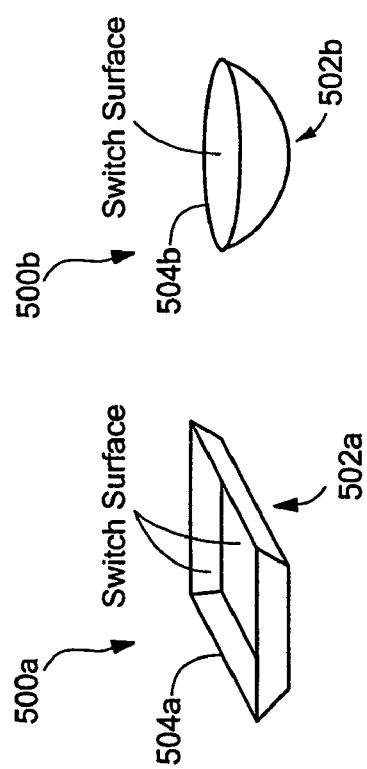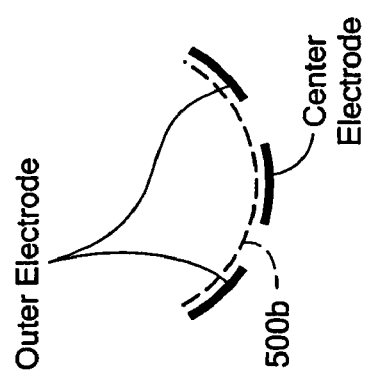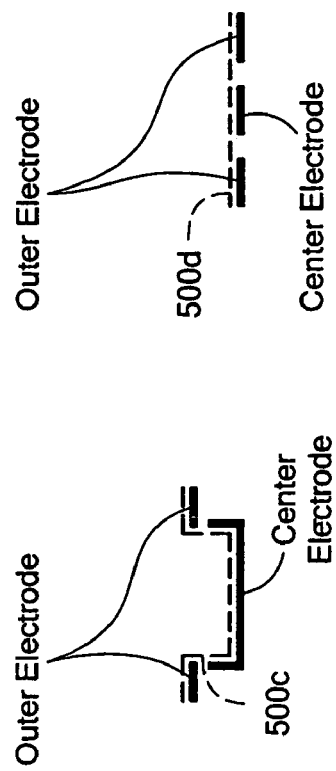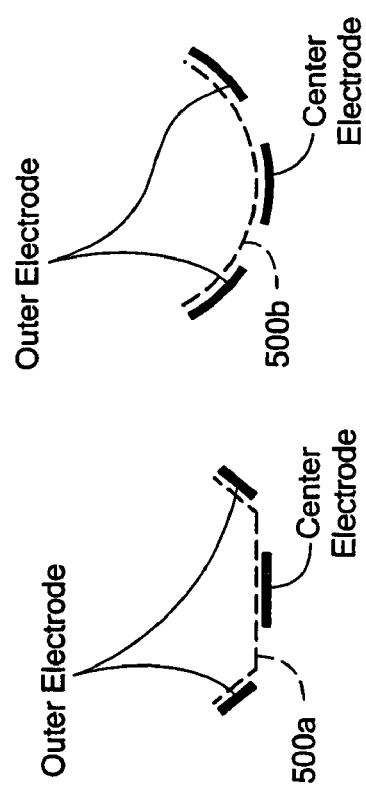

LINEAR CAPACITANCE MEASUREMENT AND TOUCHLESS SWITCH

CROSS REFERENCE TO RELATED APPLICATIONS

This application is a continuation-in-part (CIP) application of prior U.S. patent application Ser. No. 11/202,486 filed Aug. 12, 2005 entitled LINEAR CAPACITANCE MEASUREMENT AND TOUCHLESS SWITCH, now U.S. Pat. No. 7,323,886. This application claims benefit of U.S. Provisional Patent Application No. 60/690,486 filed Jun. 15, 2005 entitled LINEAR CAPACITANCE MEASUREMENT AND TOUCHLESS SWITCH, U.S. Provisional Patent Application No. 60/662,378 filed Mar. 17, 2005 entitled CAPACITANCE MEASUREMENT AND TOUCHLESS SWITCH, U.S. Provisional Patent Application No. 60/619,697 filed Oct. 19, 2004 entitled DIFFERENTIAL CAPACITANCE MEASUREMENT AND TOUCHLESS SWITCH, and U.S. Provisional Patent Application No. 60/601,610 filed Aug. 16, 2004 entitled DIFFERENTIAL CAPACITANCE MEASUREMENT AND TOUCHLESS SWITCH.

STATEMENT REGARDING FEDERALLY SPONSORED RESEARCH OR DEVELOPMENT

Not applicable

BACKGROUND OF THE INVENTION

The present invention relates generally to capacitance measurement apparatus and techniques, and more specifically to proximity detectors such as touchless switches that employ capacitance measurement techniques.

In recent years, there has been an increasing need for improved techniques of operating publicly accessible facilities and equipment without requiring a user to make physical contact with a surface of a manual activation device such as a touch switch. Such facilities and equipment include elevators, vending machines, security access panels, information terminals, etc. By not requiring a user to physically touch a switch that may have been touched and contaminated by others who had previously used the facilities or equipment, the spread of germs and diseases may be significantly reduced.

For example, a user typically operates a public facility such as an elevator by physically touching one or more switches, which may have been previously touched by a substantial number of individuals. Some of these individuals may have come from environments where they may have been exposed to contaminants such as potentially harmful or contagious toxins or pathogenic disease organisms. When such individuals make physical contact with one or more of the switches required to operate an elevator, there is a risk that the individuals may deposit contaminants onto the surface of the switches, where they may remain viable for an extended period of time. These contaminants may be later transferred from the switches to subsequent elevator users who physically touch the switches, thereby potentially causing the subsequent users to become afflicted with diseases or other serious medical conditions.

During outbreaks of the severe acute respiratory syndrome (SARS) in Asia, many members of the public were afraid to use any public facilities that required them to touch a manual activation device such as a touch switch. To mitigate the fears of the public, programs were instituted for periodically cleaning and disinfecting the surfaces of these devices. Such programs are typically ineffective, because no matter how well these activation devices are cleaned and disinfected, they may become contaminated once again by a subsequent user. As a result, the risk of transferring potentially harmful contaminants from manual activation devices such as touch switches to subsequent users of publicly accessible facilities and equipment continues unabated. Capacitance-based proximity detectors have been employed to implement activation devices that do not require a user to physically touch a surface of the device. Such proximity detectors operate according to the principle that an electric field and a capacitance are generated between two conductive objects that have different voltage potentials and are physically separated from one another. The capacitance between the two conductive objects generally increases as the surface areas of the objects increase, or as the distance between the objects decreases.

Conventional capacitance-based proximity detectors have drawbacks, however, when they are used to implement a touchless switch. For example, it is generally difficult to adjust the sensitivity of a capacitance-based proximity detector to assure that a touchless switch employing such a proximity detector can be reliably activated by a broad range of users, and that the switch is not susceptible to noise and/or environmental changes. This is due to the relatively small equivalent capacitance that the capacitance-based proximity detector is required to measure when implementing a touchless switch.

Specifically, when a human body is very near or proximate to a sensor electrode of a capacitance-based proximity detector, the proximity detector effectively measures the equivalent capacitance of two series capacitors, assuming that the stray capacitance between the capacitance sensing circuitry and circuit ground is ignored. One of the series capacitors is formed between the sensor electrode and the human body, and the other capacitor is formed between the human body and earth ground. The amount of capacitance between the sensor electrode and the human body depends primarily on the distance between them, and to a lesser extent on the size and characteristics of the human body. For example, when the human body is not very near the sensor electrode, the amount of capacitance between the sensor electrode and the human body is significantly smaller than the amount of capacitance between the human body and ground. Accordingly, a touchless switch implemented using a capacitance-based proximity detector must measure an equivalent capacitance that is significantly smaller than the capacitance typically measured by a conventional touch switch.

FIG. 1 depicts a touchless switch implemented using a capacitance-based proximity detector 100 including a sensor electrode 112, capacitance sensing circuitry 114, and the equivalent capacitances of the capacitors formed between a human finger and the sensor electrode 112 ($C_A$), the rest of the human body and the sensor electrode 112 ($C_B$), the human body and ground ($C_C$), and the capacitance sensing circuitry 114 and ground ($C_D$), which in this analysis can be ignored. When the human finger is proximate to the sensor electrode 112, the capacitance between the human body and the sensor electrode 112 can be taken as the sum of the capacitance $C_A$ between the finger and the sensor electrode 112, and the capacitance $C_B$ between the rest of the human body and the sensor electrode 112. If the human finger is not very near the sensor electrode 112, then any changes in the capacitance $C_A$ between the finger and the sensor electrode 112 are typically very small. As a result, any extraneous common-mode disturbances resulting from electrical noise or interference, changes in the characteristics of the environment, changes in the capacitance $C_C$ between the human body and ground, and/or changes in the capacitance $C_B$ between the rest of the human body and the sensor electrode 112 due to changes in the distance between the rest of the human body and the sensor electrode 112, changes in the size or characteristics of the human body, etc., may be equal to or greater than the corresponding changes in the capacitance $C_A$ between the human finger and the sensor electrode 112. Accordingly, if the sensitivity of the capacitance-based proximity detector 100 is adjusted to be highly sensitive, then the proximity detector 100 may be actuated unintentionally, due to the various extraneous common-mode disturbances listed above. However, if the capacitance-based proximity detector 100 has reduced sensitivity, then the proximity detector 100 may be inoperable due to the inability to detect the small amount of capacitance between the finger of a user and the sensor electrode 112 at a reasonable distance.

A touch switch implemented using the capacitance-based proximity detector 100 generally fares much better than a touchless switch because when a human finger touches the surface of a touch switch, the area of contact is typically much larger than just the area of a fingertip. Further, the distance between a finger and a sensor electrode of the touch switch is typically much smaller than the corresponding distance between a finger and the sensor electrode 112 of the touchless switch, even if the sensor electrode of the touch switch is disposed behind an insulating surface. The changes in capacitance between a human finger and the sensor electrode of a touch switch are therefore much larger than the corresponding changes in capacitance between a human finger and the sensor electrode 112 of a touchless switch. Accordingly, the problems described above relating to the detection of changes in the capacitance $C_A$ between a human finger and the sensor electrode 112 of the touchless switch, e.g., the changes in the capacitance $C_B$ or $C_C$ due to different users, are relatively insignificant in a touch switch.

One way of avoiding the problems described above relating to extraneous common-mode disturbances in a touchless switch is to employ known differential signal measurement techniques. Such differential signal measurement techniques can be used in touchless switches that include two sensor electrodes arranged so that the switch is actuated when the capacitance between a human finger and one of the sensor electrodes exceeds a preset threshold level relative to a second capacitance between the finger and the other sensor electrode. By directly comparing these first and second capacitances in a differential measurement to determine whether to actuate the touchless switch, extraneous common-mode disturbances that can adversely affect the measurement can be effectively canceled out.

U.S. Pat. No. 6,310,611 filed Oct. 30, 2001 entitled DIFFERENTIAL TOUCH SENSOR AND CONTROL CIRCUIT THEREFORE (the '611 patent) discloses a touch sensor that employs a differential signal measurement technique. As disclosed in the '611 patent, the touch sensor includes a first sensor electrode, a second sensor electrode positioned proximate to the first electrode, a differential circuit connected to the first and second electrodes, and a pulse or other signal source configured to generate an electric field between the first and second electrodes. Although the touch sensor of the '611 patent is configured to perform a differential measurement, the touch sensor does not operate by measuring capacitance. Instead, the touch sensor measures changes in the voltage difference between the two sensor electrodes caused by the introduction of an object affecting the electric field around the two electrodes. The touch sensor employs a differential circuit to provide an output signal that is responsive to this difference in voltage between the two electrodes.

The touch sensor disclosed in the '611 patent has drawbacks, however, when used to implement a touchless switch. For example, the above-described changes in the voltage difference between the two sensor electrodes of the touch sensor resulting from the introduction of an object are caused by the interaction of the electric fields associated with the sensor electrodes and the object. This interaction of electric fields is relatively complex because the two sensor electrodes and the object are at different voltage potentials, and there is no precise relationship governing the voltage difference between the sensor electrodes and the proximity of the object to the sensor electrodes. Furthermore, the methods disclosed in the '611 patent to measure the voltage difference between the sensor electrodes are only effective if the voltage difference is significant enough as in the case of a touch switch. Therefore, the approach disclosed in the '611 patent is not precise or sensitive enough to be used in a touchless switch.

U.S. Pat. No. 6,456,477 filed Sep. 24, 2002 entitled LINEAR CAPACITANCE DETECTION CIRCUIT (the '477 patent) discloses capacitance detection circuitry that employs a differential signal measurement technique. As disclosed in the '477 patent, the linear capacitance detection circuitry includes a circuit that measures a difference in capacitance between a first capacitor and a second capacitor by driving the two capacitors with pulses. The capacitance detection circuitry further includes an operational amplifier with negative feedback configured to maintain the two capacitors at substantially equal voltage potentials. As a result, there is a linear relationship between an electrical signal produced by the operational amplifier and the ratio of the capacitances of the two capacitors. The approach disclosed in the '477 patent also has drawbacks, however, in that it requires pulse signals, which can introduce transient noises and instability to the operational amplifier and can adversely affect the accuracy of the operational amplifier output. Although low pass filters and a feedback capacitor may be employed at the inputs of the operational amplifier to mitigate the effects of transient noises and instability, the addition of such components adversely affects the accuracy and sensitivity of the capacitance detection circuitry.

It would therefore be desirable to have a capacitance measurement apparatus and technique, and a proximity detector such as a touchless switch employing a capacitance measurement technique, that avoid the drawbacks of the above-described approaches.

BRIEF SUMMARY OF THE INVENTION

In accordance with the present invention, a capacitance measurement apparatus and technique are provided that can be employed to enhance the sensitivity and accuracy of many different types of capacitive transducers, proximity sensors, and touchless switches. The presently disclosed capacitance measurement apparatus directly and accurately produces a linear response to changes in each of the ratios of the capacitance of a capacitor/capacitive transducer to the capacitance of one or more other different capacitors/capacitive transducers with adjustable offset, while maintaining all of the capacitors/capacitive transducers at substantially identical voltage potentials at all times. The presently disclosed capacitance measurement apparatus also produces a linear response to changes in each of the differences between the capacitance of a capacitor/capacitive transducer multiplied by a first constant factor and the capacitance of one or more other different capacitors/capacitive transducers each being multiplied by a respective second constant factor, while maintaining all of the capacitors/capacitive transducers at substantially identical voltage potentials at all times.

Additionally, the presently disclosed capacitance measurement apparatus directly and accurately produces a linear response to changes in the capacitance, or changes in the reciprocal of the capacitance, of a capacitor/capacitive transducer with adjustable offset, without requiring special calibration or adjustment over a wide range of capacitance values. The presently disclosed capacitance measurement apparatus also provides a simple way of measuring the capacitance, or the reciprocal of the capacitance, of a large number of capacitors/capacitive transducers, or comparing the capacitance of a large number of capacitors/capacitive transducers with the capacitance of a large number of sets of capacitors/capacitive transducers.

The presently disclosed capacitance measurement apparatus employs a plurality of operational amplifiers for maintaining the voltage potentials of multiple capacitors/capacitive transducers undergoing comparison or measurement at substantially the same voltage potential at all times. Because the multiple capacitors/capacitive transducers are maintained at substantially the same voltage potential, there is essentially no capacitance between them. For this reason, the capacitance measurement apparatus can be employed to measure small changes in the capacitances of the multiple capacitors/capacitive transducers without having adjacent capacitors/capacitive transducers affect the capacitance measurement, even when the capacitors/capacitive transducers are positioned relatively close to one another. In one embodiment, the capacitance measurement apparatus includes a first operational amplifier A1, and a second operational amplifier A2 configured as a difference amplifier. A difference amplifier, as the term is used herein, refers to a circuit or device that amplifies a difference between two input signals and includes different types of differential DC amplifiers such as instrumentation amplifiers, etc. Each of two capacitors C1 and C2 undergoing comparison or measurement has one end connected to circuit ground, and another end connected to one of the differential inputs of operational amplifier A1. Capacitor C1 is connected to the inverting input of operational amplifier A1, and capacitor C2 is connected to the non-inverting input of operational amplifier A1. Both capacitors C1 and C2 are driven by the output of a periodic varying voltage source such as a sinusoidal voltage source through respective resistors connected to corresponding inputs of operational amplifier A1. A feedback resistor is connected between the output of operational amplifier A1 and its inverting input. Due to the high open loop gain of operational amplifier A1, capacitors C1 and C2 are maintained at substantially the same voltage potential at all times. There is a linear relationship between the magnitude of the current flowing through the feedback resistor and the ratio of the capacitance of capacitor C1 to the capacitance of capacitor C2. Further, the current flowing through the feedback resistor is in-phase or out-of-phase with the currents flowing through the resistors connected to the periodic varying voltage source, depending on whether the ratio is less than or greater than a specified value. The phase and magnitude of the current flowing through the feedback resistor can be measured by difference amplifier A2, having one of its differential inputs connected to the output of operational amplifier A1 and another differential input connected to one of the differential inputs of operational amplifier A1.

In a second embodiment, the capacitance measurement apparatus includes a first operational amplifier A1, and a second operational amplifier A2 configured as a difference amplifier. Each of two capacitors C1 and C2 undergoing comparison or measurement has one end connected to circuit ground, and another end connected to one of the differential inputs of operational amplifier A1. Capacitor C1 is connected to the inverting input of operational amplifier A1, and capacitor C2 is connected to the non-inverting input of operational amplifier A1. The non-inverting input of operational amplifier A1 is driven directly by the output of a first periodic varying current source such as a sinusoidal current source, while the inverting input of operational amplifier A1 is driven directly by a second periodic varying current source whose output is K (a constant) times that of the first periodic varying current source. A feedback resistor is connected between the output of operational amplifier A1 and its inverting input. Due to the high open loop gain of operational amplifier A1, capacitors C1 and C2 are maintained at substantially the same voltage potential at all times. There is a linear relationship between the magnitude of the current flowing through the feedback resistor and the ratio of the capacitance of capacitor C1 to the capacitance of capacitor C2. Further, the current flowing through the feedback resistor is in-phase or out-of-phase with the outputs of the periodic varying current sources, depending on whether the ratio is less than or greater than the value of K. The phase and magnitude of the current flowing through the feedback resistor can be measured by difference amplifier A2, having one of its differential inputs connected to the output of operational amplifier A1 and another differential input connected to one of the differential inputs of operational amplifier A1.

In a third embodiment, the capacitance measurement apparatus includes first and second operational amplifiers A0 and A1, and a third operational amplifier A2 configured as a difference amplifier. Each of two capacitors C1 and C2 undergoing comparison or measurement, having capacitances of $c1$ and $c2$, respectively, has one end connected to circuit ground, and another end connected to the inverting input of operational amplifier A0 or A1. Capacitor C1 is connected to the inverting input of operational amplifier A1, and capacitor C2 is connected to the inverting input of operational amplifier A0. The non-inverting inputs of operational amplifiers A0 and A1 are both driven directly by a periodic varying voltage source such as a sinusoidal voltage source. A first feedback resistor R1 having a resistance of $r1$ is connected between the output of operational amplifier A1 and its inverting input. A second feedback resistor R2 having a resistance of $r2$ is connected between the output of operational amplifier A0 and its inverting input. Due to the high open loop gain of operational amplifiers A0 and A1, the two capacitors C1 and C2 are maintained at substantially the same voltage potential as the periodic varying voltage source at all times. The output of operational amplifier A1 is connected to the non-inverting input of difference amplifier A2, and the output of operational amplifier A0 is connected to the inverting input of difference amplifier A2. The output of difference amplifier A2 is proportional to $(r1*c1-r2*c2)$, and is in-phase or out-of-phase with the currents flowing through resistors R1 and R2, depending on whether $(r1*c1-r2*c2)$ is greater than or less than zero.

Each embodiment of the presently disclosed capacitance measurement apparatus can be configured for comparing the capacitance of a capacitor/capacitive transducer to the capacitance of a plurality of other different capacitors/capacitive transducers, while maintaining all of the capacitors/capacitive transducers at substantially the same voltage potential. Additionally, by switching the respective capacitors/capacitive transducers in and out for subsequent comparison or measurement, each embodiment of the capacitance measurement apparatus can sequentially measure the capacitance, or the reciprocal of the capacitance, of multiple capacitors/capacitive transducers, or compare the capacitance of multiple capacitors/capacitive transducers to the capacitance of multiple sets of capacitors/capacitive transducers.

Touchless switches and proximity sensors are also provided that employ embodiments of the presently disclosed capacitance measurement apparatus. The touchless switches are configured to be actuated by a human finger or a finger-like object, requiring the finger or finger-like object to reach a specified boundary before actuating the switch. The touchless switches have reduced susceptibility to unintended actuations, and reduced sensitivity to changes in environmental factors such as temperature, humidity, etc., and to electrical noise, while having a simple and rugged construction. The touchless switches can be used in hygiene-sensitive applications, industrial control panels, and a wide variety of facilities and equipment accessible to the general public, including but not limited to elevators, vending machines, security access panels, information terminals, etc.

In one embodiment, the touchless switch includes a front surface, and two adjacent sensor electrodes maintained at substantially the same voltage potential disposed on or behind the front surface of the switch. As a result, there is substantially no capacitance between the two sensor electrodes, and therefore the sensor electrodes operate essentially independent of one another. One of the sensor electrodes is a center electrode, and the other sensor electrode is an outer electrode. The center electrode is spaced from and at least partly surrounded by the outer electrode. When the tip of a human finger or finger-like object is near or proximate to the center electrode, the presence of the finger or finger-like object can be detected using an embodiment of the capacitance measurement apparatus disclosed herein. The capacitance measurement apparatus can be employed to measure the ratio of the capacitance of the two sensor electrodes with respect to the finger or finger-like object, or the difference between the capacitance of one sensor electrode with respect to the finger or finger-like object multiplied by a first constant factor, and the capacitance of the other sensor electrode with respect to the finger or finger-like object multiplied by a second constant factor, thereby substantially canceling out extraneous common-mode disturbances such as the capacitance between the rest of the human body and the sensor electrodes, the capacitance between the human body and earth ground, environmental changes, electrical noise, etc., which tend to affect both sensor electrodes equally due to their close proximity to one another. The capacitance ratio and difference measurements performed by the capacitance measurement apparatus are facilitated by the fixed geometrical shape, size, and relative positions of the two sensor electrodes. The outer electrode may be placed in front of the center electrode so that initially, when the finger or finger-like object moves toward the center electrode, the capacitance ratio or difference measurement is less than a preset threshold. As the finger or finger-like object moves closer to the center electrode, the capacitance ratio or difference measurement eventually exceeds the preset threshold, thereby actuating the switch. The touchless switch may also include a guard electrode surrounding the back and sides of the two sensor electrodes. The guard electrode and the sensor electrodes are maintained at substantially the same voltage potential so that each sensor electrode forms a capacitor only with objects disposed in front of it. Leads extending from the two sensor electrodes to the capacitance measurement apparatus may also be guarded using a twin-axial cable or two coaxial cables, in which the outer conductors of the cables are employed as guard shields and maintained at substantially the same voltage potential as the inside cable conductors connected to the sensor electrodes. The front surface of the touchless switch may take the form of the surface of a container, in which the brim of the container surface defines an imaginary boundary plane that the finger or finger-like object must reach to actuate the switch.

The presently disclosed capacitance measurement apparatus may be employed to detect the proximity of conductive objects larger than a human finger such as the palm of a human hand. The presently disclosed capacitance measurement apparatus may also be employed to detect the location, position, and/or movement of a conductive object such as a human appendage within a specified area.

Other features, functions, and aspects of the invention will be evident from the Detailed Description of the Invention that follows.

BRIEF DESCRIPTION OF THE SEVERAL
VIEWS OF THE DRAWINGS

The invention will be more fully understood with reference to the following Detailed Description of the Invention in conjunction with the drawings of which:

FIGS. 5a-5d are perspective views of illustrative shapes of a front surface of a touchless switch according to the present invention;

FIGS. 6a-6d are cross-sectional views of illustrative arrangements and relative positions of two sensor electrodes and the front surfaces of the touchless switches of FIGS. 5a-5d, respectively;

FIG. 8a is a diagram of a touchless switch employing the first capacitance measurement circuitry of FIG. 2a;

FIG. 8b is a diagram of a set of touchless switches employing the first capacitance measurement circuitry of FIG. 2a;

FIG. 9a is a diagram of a touchless switch employing the second capacitance measurement circuitry of FIG. 3a;

FIG. 9b is a diagram of a set of touchless switches employing the second capacitance measurement circuitry of FIG. 3a;

FIG. 10a is a diagram of a touchless switch employing the third capacitance measurement circuitry of FIG. 4a; and FIG. 10b is a diagram of a set of touchless switches employing the third capacitance measurement circuitry of FIG. 4a.

DETAILED DESCRIPTION OF THE INVENTION

The entire disclosures of U.S. patent application Ser. No. 11/202,486 filed Aug. 12, 2005 entitled LINEAR CAPACITANCE MEASUREMENT AND TOUCHLESS SWITCH, U.S. Provisional Patent Application No. 60/690,486 filed Jun. 15, 2005 entitled LINEAR CAPACITANCE MEASUREMENT AND TOUCHLESS SWITCH, U.S. Provisional Patent Application No. 60/662,378 filed Mar. 17, 2005 entitled CAPACITANCE MEASUREMENT AND TOUCHLESS SWITCH, U.S. Provisional Patent Application No. 60/619,697 filed Oct. 19, 2004 entitled DIFFERENTIAL CAPACITANCE MEASUREMENT AND TOUCHLESS SWITCH, and U.S. Provisional Patent Application No. 60/601,610 filed Aug. 16, 2004 entitled DIFFERENTIAL CAPACITANCE MEASUREMENT AND TOUCHLESS SWITCH, are incorporated herein by reference.

Figure 1:
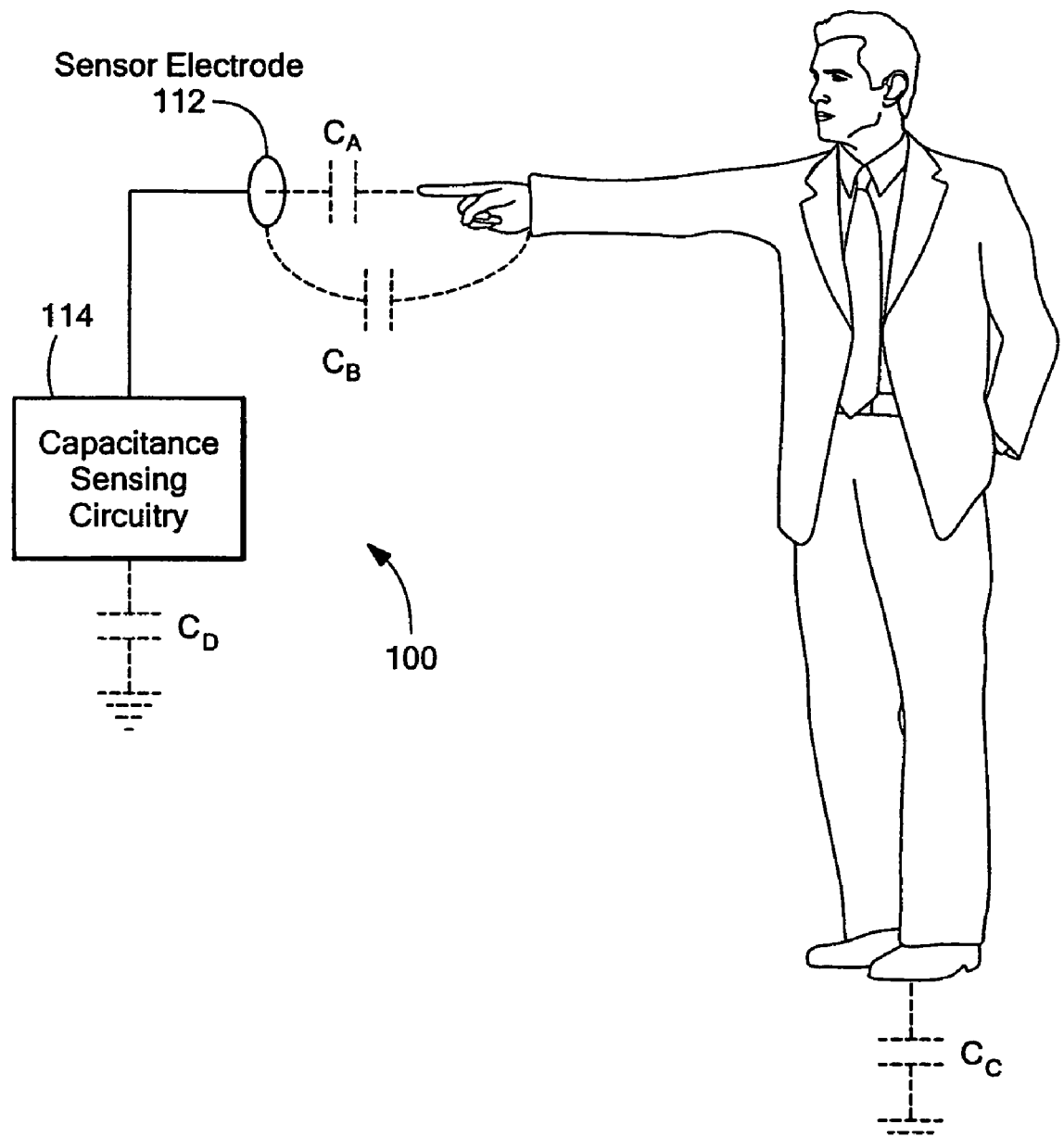
FIG. 1 illustrates various equivalent capacitances formed between a human body, earth ground, and a sensor electrode coupled to capacitance sensing circuitry.
Figure 2A:
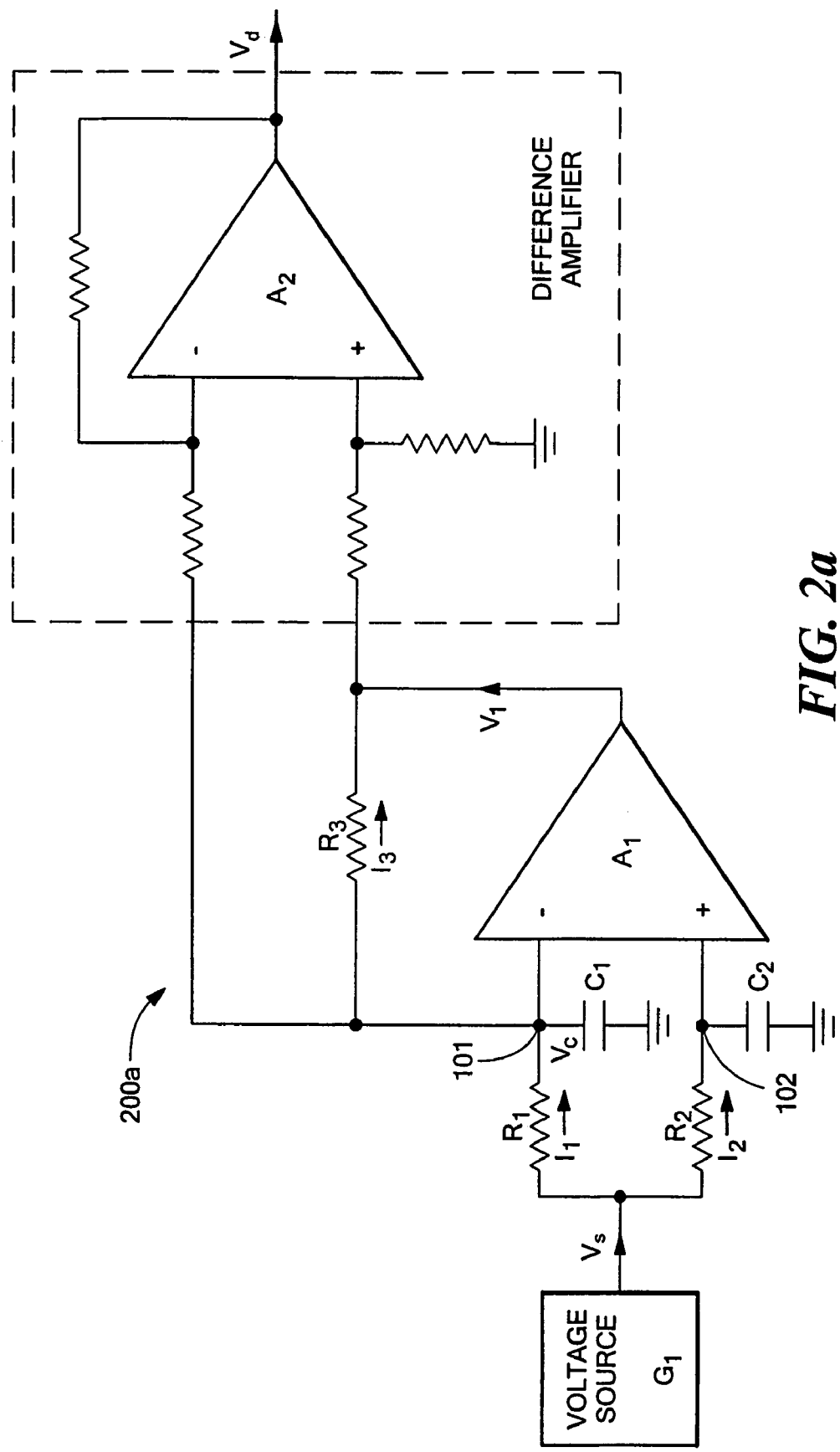
FIG. 2a is a schematic diagram of first capacitance measurement circuitry according to the present invention.

A capacitance measurement apparatus and technique are disclosed that can be employed to enhance the sensitivity and accuracy of many different types of capacitive transducers, proximity sensors, and touchless switches. FIG. 2a depicts a first illustrative embodiment of capacitance measurement circuitry $200a$, in accordance with the present invention. In the illustrated embodiment, the capacitance measurement circuitry $200a$ includes a periodic varying voltage source G1, a first operational amplifier A1, and a second operational amplifier A2 configured as a difference amplifier. Each of two capacitors/capacitive transducers C1 and C2 undergoing comparison, having capacitances of c1 and c2, respectively, has one end connected to circuit ground, and another end connected to one of the differential inputs of operational amplifier A1. Capacitor C1 is connected to the inverting input of operational amplifier A1 at node 101, and capacitor C2 is connected to the non-inverting input of operational amplifier A1 at node 102. The nodes 101 and 102 are driven by an output Vs of the periodic varying voltage source G1, which may be a sinusoidal voltage source, through resistors R1 and R2, respectively. Resistor R1 has a resistance r1, and resistor R2 has a resistance r2. Output V1 of operational amplifier A1 is fed back to the inverting input of operational amplifier A1 via feedback resistor R3 having a resistance of r3. Because operational amplifier A1 has a very high open loop gain, the two inputs of operational amplifier A1 are maintained at substantially the same voltage potential, thereby causing the effective RC time constants for capacitors C1 and C2 at nodes 101 and 102 to be substantially the same. The magnitude i3 of current I3 flowing through resistor R3 is substantially equal to the magnitude i2 of current I2 flowing into capacitor C2 multiplied by the factor (r2/r1−c1/c2), i.e., $i3=i2*(r2/r1-c1/c2)$. Current I3 flowing through resistor R3 will be in-phase or out-of-phase with current I1 flowing through resistor R1 and current I2 flowing through resistor R2, depending on whether the ratio of the capacitances c1/c2 is less than or greater than the value r2/r1. More specifically, if c1/c2 is less than r2/r1, then (r2/r1−c1/c2) is positive and the currents I2 and I3 will be in-phase but if c1/c2 is greater than r2/r1, then (r2/r1−c1/c2) is negative and the currents I2 and I3 will be out of phase. At steady state, the magnitude i2 of current I2 flowing into capacitor C2 is a function of time, and therefore the magnitude i3 of current I3 flowing through resistor R3 at a fixed time of a cycle of current I3 is an accurate measure of the value (r2/r1−c1/c2). The voltage across resistor R3 is equal to i3*r3, and is equivalent to the difference of the voltage potential between node 101 (or node 102) and output V1 of operational amplifier A1. This voltage can be measured by connecting node 101 (or node 102) to one of the two inputs of difference amplifier A2, and by connecting output V1 of operational amplifier A1 to the other input of difference amplifier A2. It should be noted that the configuration of difference amplifier A2, as shown in FIG. 2a, is described herein for purposes of illustration, and that other suitable circuit configurations may be employed. For example, alternative configurations of difference amplifier A2 may include more than one operational amplifier. Output Vd of difference amplifier A2 is proportional to the magnitude i3 of current I3 flowing through resistor R3, and will be in-phase with currents I1 and I2 when c1/c2 is greater than r2/r1. It is noted that the phase of output Vd reverses if the inputs to difference amplifier A2 are interchanged.

Output Vd of difference amplifier A2 is therefore proportional to a signal representing current I2 modulated by the value (c1/c2−r2/r1). If current I2 is sinusoidal, then the change in the ratio of the capacitances c1/c2 can be measured using a synchronous demodulator. Further, there is a linear relationship between output Vd at a fixed time of a cycle of the output (e.g., at the peak of the cycle), the average absolute value of its positive and/or negative cycles, or the signal extracted from output Vd using synchronous demodulation (if output Vs of the voltage source G1 is sinusoidal), and the ratio of the capacitances c1/c2. Accordingly, there is a linear relationship between output Vd at a fixed time of a cycle of the output, the average absolute value of its positive and/or negative cycles, or the signal extracted from the output using synchronous demodulation, and the capacitance c1 if capacitor C2 has a fixed capacitance, or the reciprocal of the capacitance c2 if capacitor C1 has a fixed capacitance, which is particularly useful when measuring distances because the capacitance between two conductive objects, e.g., two plates, is inversely proportional to the distance between them.

Figure 2B:
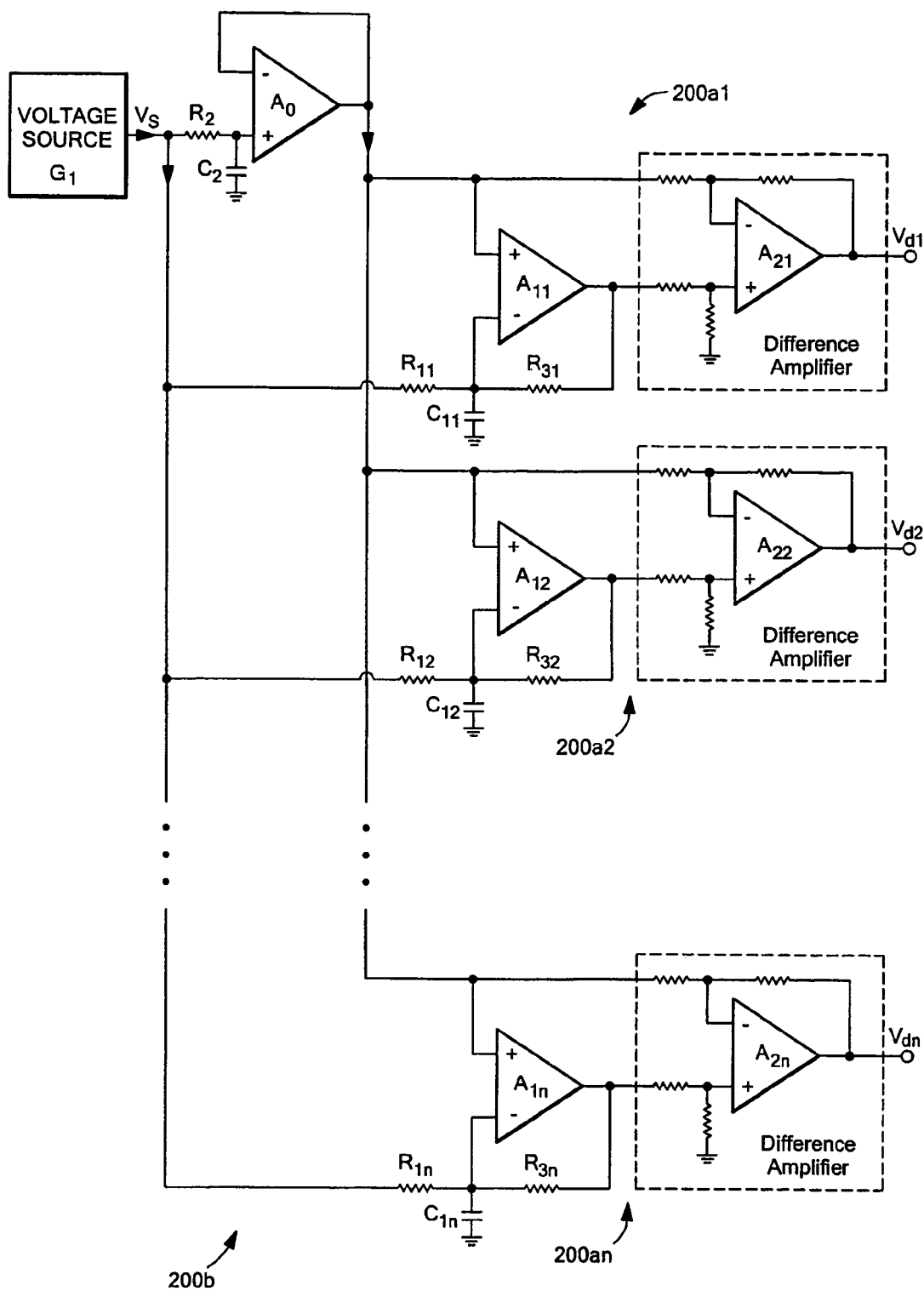
FIG. 2b is a schematic diagram of circuitry employing the first capacitance measurement circuitry of FIG. 2a, for producing a linear response to changes in each of the ratios of the capacitance of a capacitor to the capacitance of one or more other different capacitors.

FIG. 2b depicts circuitry $200b$ employing capacitance measurement circuitry $200a1$-$200an$ to produce a linear response to changes in each of the ratios of the capacitance of a capacitor/capacitive transducer to the capacitance of one or more other different capacitors/capacitive transducers, while keeping all of the capacitors/capacitive transducers at substantially identical voltage potentials at all times. Each of a plurality of capacitors/capacitive transducers C11-C1$n$ having capacitances of c11-c1$n$, respectively, is compared to the capacitance c2 of capacitor/capacitive transducer C2 coupled between the non-inverting input of an operational amplifier A0 and ground (see FIG. 2b). Each of the capacitance measurement circuitry $200a1$-$200an$ operates like the capacitance measurement circuitry $200a$ (see FIG. 2a), with the exception that the voltage potentials at capacitors C11-C1$n$ are compared to the level of the output of operational amplifier A0, which is configured as a voltage follower to produce substantially the same voltage potential as that across capacitor C2. It is noted that capacitor C2 is driven by output Vs of the voltage source G1 through resistor R2. Thus, there is a linear relationship between each of outputs Vd1-Vd$n$ at a fixed time of a cycle of the output (e.g., at the peak of the cycle), the average absolute value of its positive and/or negative cycles, or the signal extracted from the output using synchronous demodulation (if output Vs of the voltage source G1 is sinusoidal), and the ratio of the capacitances c11/c2 through c1$n$/c2, respectively. As a result, there is a linear relationship between each of outputs Vd1-Vdn at a fixed time of a cycle of the output, the average absolute value of its positive and/or negative cycles, or the signal extracted from the output using synchronous demodulation, and the capacitances c11-c1$n$, respectively, if C2 has a fixed capacitance.

Figure 3A:
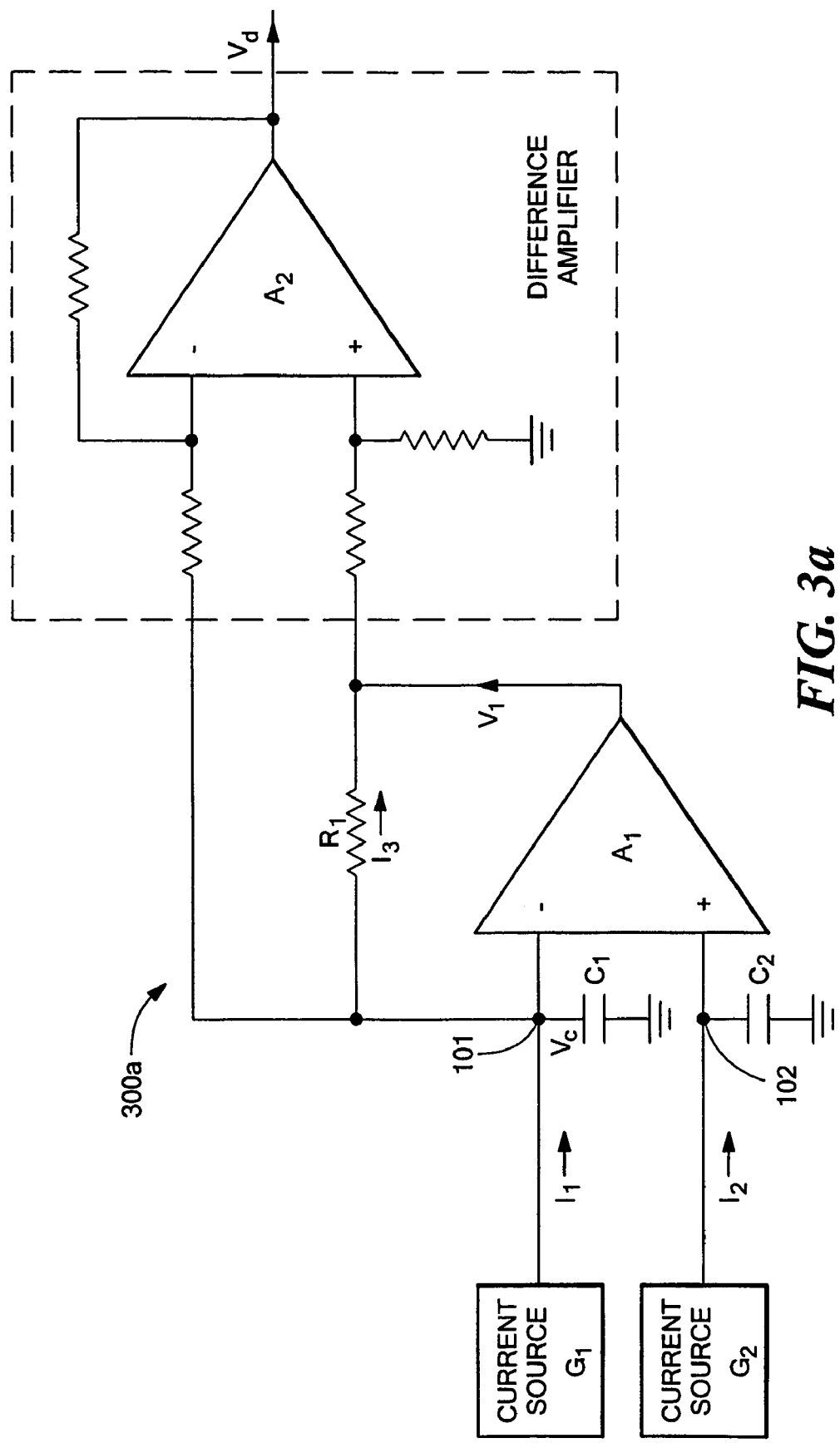
FIG. 3a is a schematic diagram of second capacitance measurement circuitry according to the present invention.
Figure 3B:
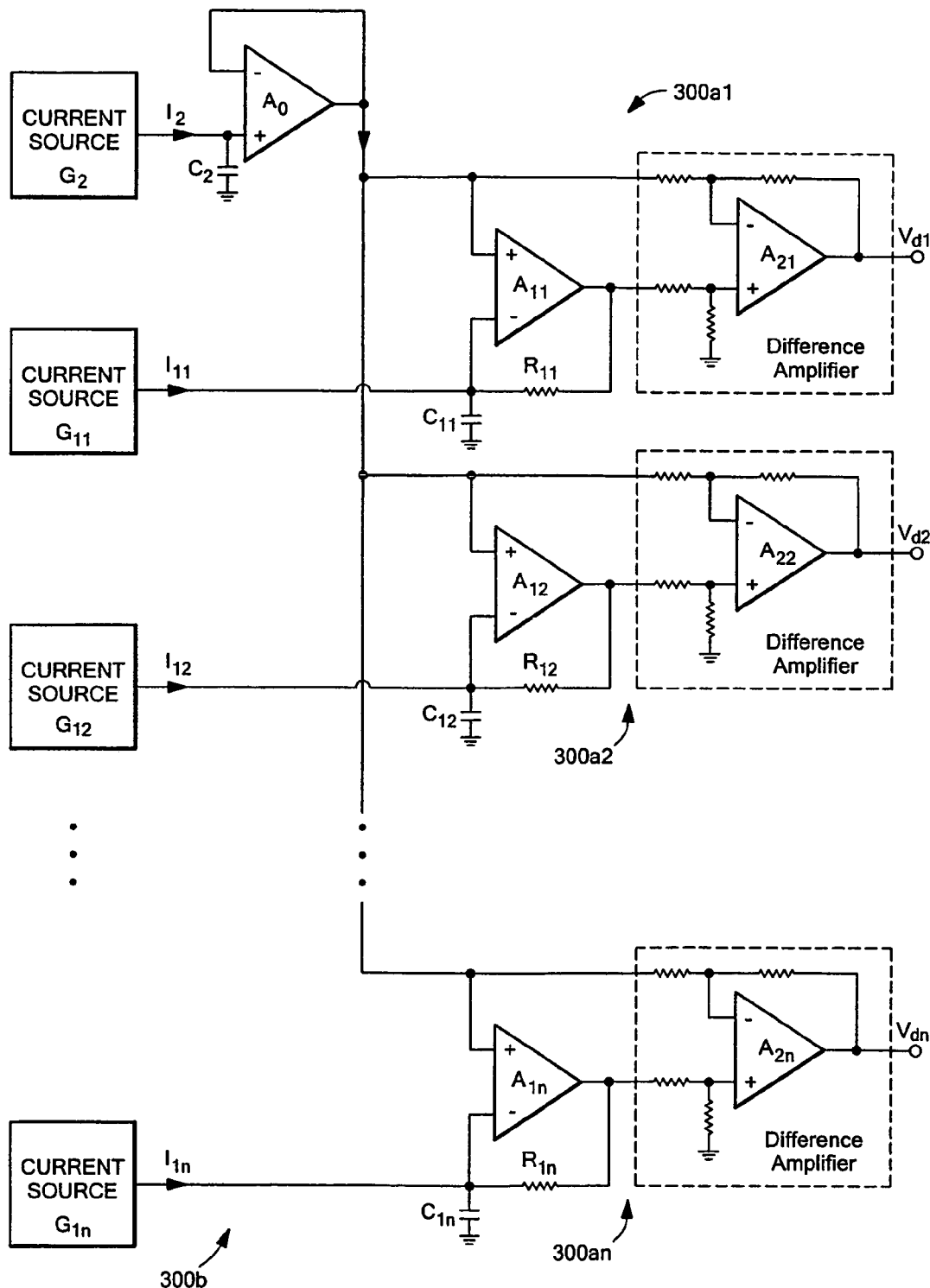
FIG. 3b is a schematic diagram of circuitry employing the second capacitance measurement circuitry of FIG. 3a, for producing a linear response to changes in each of the ratios of the capacitance of a capacitor to the capacitance of one or more other different capacitors.

FIG. 3$a$ depicts a second illustrative embodiment of capacitance measurement circuitry 300$a$, in accordance with the present invention. In the illustrated embodiment, the capacitance measurement circuitry 300$a$ includes periodic varying current sources G1 and G2, a first operational amplifier A1, and a second operational amplifier A2 configured as a difference amplifier. Each of two capacitors/capacitive transducers C1 and C2 undergoing comparison, having capacitances c1 and c2, respectively, has one end connected to circuit ground, and another end connected to one of the differential inputs of operational amplifier A1. Capacitor C1 is connected to the inverting input of operational amplifier A1 at node 101, and capacitor C2 is connected to the non-inverting input of operational amplifier A1 at node 102. The node 102 is driven by output current I2 of the periodic varying current source G2. The node 101 is driven by output current I1 of the periodic varying current source G1, in which I1 is equal to K times I2, K being a constant greater than or equal to zero. Output V1 of operational amplifier A1 is fed back to its inverting input via feedback resistor R1 having a resistance r1. Because operational amplifier A1 has a very high open loop gain, the two inputs of operational amplifier A1 are maintained at substantially the same voltage potential. Therefore, the magnitude i3 of current I3 flowing through resistor R1 is substantially equal to the magnitude i2 of current I2 flowing into capacitor C2 multiplied by the factor (K−c1/c2), i.e., i3=i2*(K−c1/c2). Current I3 flowing through resistor R1 will be in-phase or out-of-phase with currents I1 and I2, depending on whether the ratio of the capacitances c1/c2 is less than or greater than K. More specifically, if c1/c2 is less than K, then (K−c1/c2) is positive and currents I2 and I3 will be in-phase but if c1/c2 is greater than K, then (K−c1/c2) is negative and currents I2 and I3 will be out of phase. At steady state, the magnitude i2 of current I2 flowing into capacitor C2 is only a function of time, and therefore the magnitude i3 of current I3 flowing through resistor R1 at a fixed time of a cycle of the current I3 is an accurate measure of the value (K−c1/c2). The voltage across resistor R1 is substantially equal to i3*r1, and is equivalent to the difference of the voltage potential between node 101 (or node 102) and output V1 of operational amplifier A1. The voltage across resistor R1 can be measured by connecting node 101 (or node 102) to one of the two inputs of difference amplifier A2, and by connecting output V1 of operational amplifier A1 to the other input of difference amplifier A2. It should be noted that the configuration of difference amplifier A2, as shown in FIG. 3$a$, is described herein for purposes of illustration, and that other suitable circuit configurations may be employed. For example, alternative configurations of difference amplifier A2 may include more than one operational amplifier. Output Vd of difference amplifier A2 is proportional to the magnitude i3 of current I3 flowing through resistor R1, and will be in-phase with currents I1 and I2 when the ratio of the capacitances c1/c2 is greater than K. It is noted that the phase of output Vd reverses if the inputs to difference amplifier A2 are interchanged. Output Vd of difference amplifier A2 is therefore proportional to a signal representing current I2 modulated by the value (c1/c2-K). In the event the constant K equals 0, i.e., there is no current source G1, output Vd of difference amplifier A2 is proportional to a signal representing current I2 modulated by the value c1/c2. If current I2 is sinusoidal, then the change in the ratio of the capacitances c1/c2 can be measured using a synchronous demodulator for all values of K. Further, there is a linear relationship between output Vd at a fixed time of a cycle of the output (e.g., at the peak of the cycle), the average absolute value of its positive and/or negative cycles, or the signal extracted from the output using synchronous demodulation (if output I2 of the current source G2 is sinusoidal), and the ratio of the capacitances c1/c2. Thus, there is a linear-relationship between output Vd at a fixed time of a cycle of the output, the average absolute value of its positive and/or negative cycles, or the signal extracted from the output using synchronous demodulation, and the capacitance c1 if capacitor C2 has a fixed capacitance, or the reciprocal of the capacitance c2 if capacitor C1 has a fixed capacitance, which is particularly useful when measuring distances because the capacitance between two conductive objects, e.g., two plates, is inversely proportional to the distance between them. It should be noted that if the current sources G1 and G2 have significant dc components in their outputs, then bypass resistors may be placed across capacitors C1 and C2.

FIG. 3$b$ depicts circuitry 300$b$ employing capacitance measurement circuitry 300$a$1-300$an$ to produce a linear response to changes in each of the ratios of the capacitance of a capacitor/capacitive transducer to the capacitance of one or more other different capacitors/capacitive transducers, while keeping all of the capacitors/capacitive transducers at substantially identical voltage potentials at all times. Each of the capacitors/capacitive transducers C11-C1$n$ having capacitances c11-c1$n$, respectively, is compared to the capacitance c2 of capacitor/capacitive transducer C2 coupled between the non-inverting input of operational amplifier A0 and ground (see FIG. 3$b$). Capacitors C11-C1$n$ are driven by current sources G11-G1$n$, respectively. Each of the respective outputs I11-I1$n$ of the current sources G11-G1$n$ is equal to I2 times a respective constant K11-K1$n$, in which each of the constants K11-K1$n$ is greater than or equal to zero. Each of the capacitance measurement circuitry 300$a$1-300$an$ operates like the capacitance measurement circuitry 300$a$ (see FIG. 3$a$), with the exception that the voltage potentials at capacitors C11-C1$n$ are compared to the level of the output of operational amplifier A0, which is configured as a voltage follower to produce substantially the same voltage potential as that across capacitor C2, which is driven by output I2 of current source G2. Therefore, there is a linear relationship between each of outputs Vd1-Vdn at a fixed time of a cycle of the output (e.g., at the peak of the cycle), the average absolute value of its positive and/or negative cycles, or the signal extracted from the output using synchronous demodulation (if output I2 of the current source G2 is sinusoidal), and the ratio of the capacitances c11/c2 through c1$n$/c2, respectively. As a result, there is a linear relationship between each of outputs Vd1-Vdn at a fixed time of a cycle of the output, the average absolute value of its positive and/or negative cycles, or the signal extracted from the output using synchronous demodulation, and the capacitances c11-c1$n$, respectively, if C2 has a fixed capacitance.

Figure 4A:
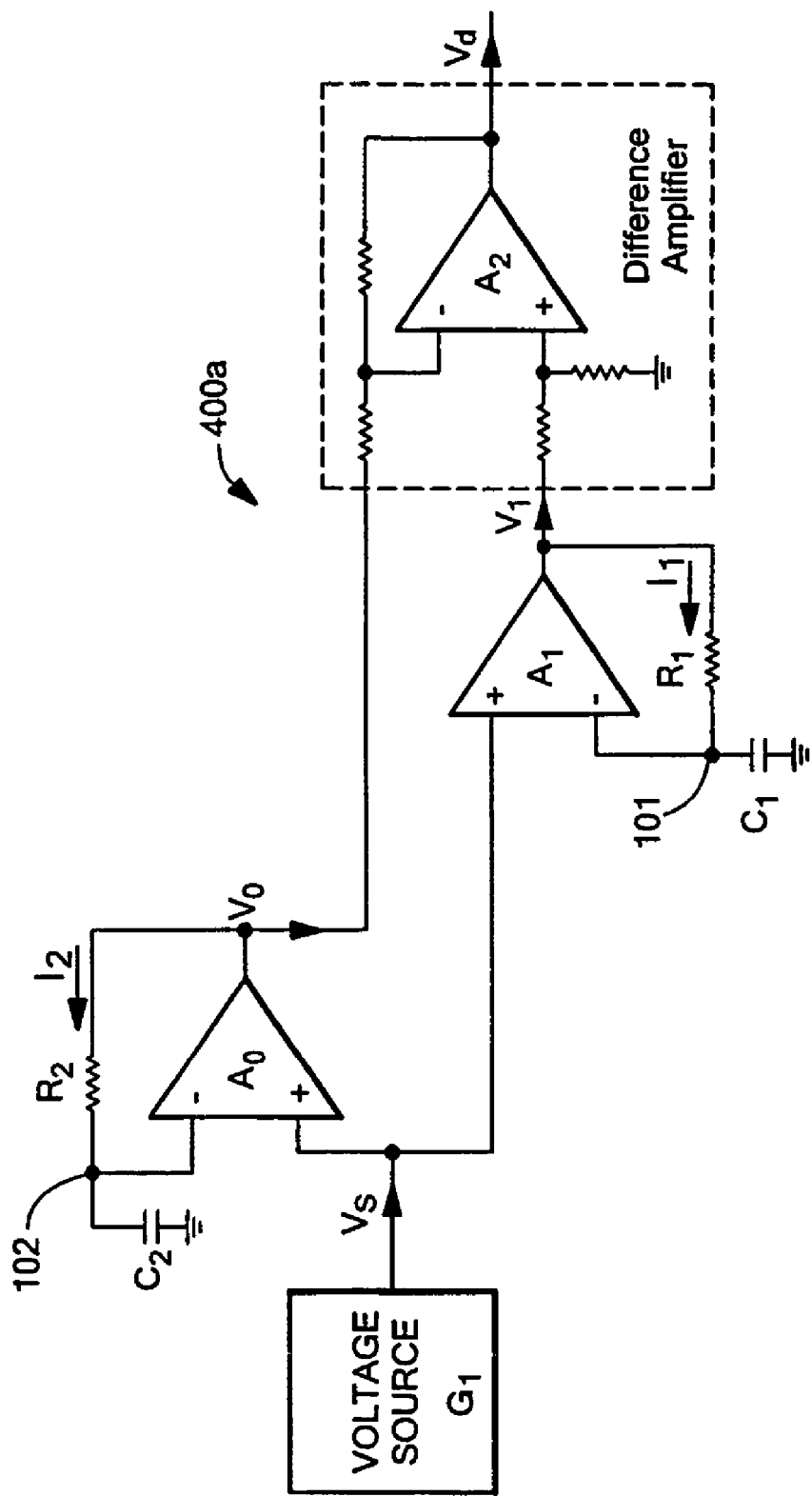
FIG. 4a is a schematic diagram of third capacitance measurement circuitry according to the present invention.

FIG. 4$a$ depicts a third illustrative embodiment of capacitance measurement circuitry 400$a$, in accordance with the present invention. In the illustrated embodiment, the capacitance measurement circuitry 400$a$ includes a periodic varying voltage source G1, a first operational amplifier A0, a second operational amplifier A1, and a third operational amplifier A2 configured as a difference amplifier. Each of two capacitors/capacitive transducers C1 and C2 undergoing comparison, having capacitances c1 and c2, respectively, has one end connected to circuit ground, and another end connected to the inverting input of operational amplifier A0 or operational amplifier A1. Capacitor C1 is connected to the inverting input of operational amplifier A1 at node 101, and capacitor C2 is connected to the inverting input of operational amplifier A0 at node 102. A first feedback resistor R1 having resistance r1 is connected between the output of operational amplifier A1 and its inverting input. Similarly, a second feedback resistor R2 having resistance r2 is connected between the output of operational amplifier A0 and its inverting input. The non-inverting inputs of operational amplifiers A1 and A0 are both driven by output Vs of the periodic varying voltage source G1, which may be a sinusoidal voltage source. Due to the high open loop gain of operational amplifiers A1 and A0, capacitors C1 and C2 are maintained at substantially the same voltage potential as output Vs of the voltage source G1 at all times. V0 is the output of the operational amplifier A0 and V1 is the output of the operational amplifier A1. (V1−Vs) is equal to the time derivative of Vs multiplied by the value (r1*c1), i.e., (V1−Vs)=r1*c1*dVs/dt, and is in-phase with current I1 flowing through resistor R1 into capacitor C1. (V0−Vs) is equal to the time derivative of Vs multiplied by the value (r2*c2), i.e., (V0−Vs)=r2*c2*dVs/dt, and is in-phase with current I2 flowing through resistor R2 into capacitor C2. When output V1 of operational amplifier A1 is provided to the non-inverting input of difference amplifier A2, while output V0 of operational amplifier A0 is provided to the inverting input of difference amplifier A2, output Vd of difference amplifier A2 is proportional to a signal representing the time derivative of Vs modulated by the value (r1*c1−r2*c2), and is in-phase or out-of-phase with current flowing through resistors R1 and R2, depending on whether (r1*c1−r2*c2) is greater than or less than zero (the phase of output Vd reverses if the inputs to difference amplifier A2 are interchanged). It should be noted that the configuration of difference amplifier A2, as shown in FIG. 4a, is described herein for purposes of illustration, and that other suitable circuit configurations may be employed. For example, alternative configurations of difference amplifier A2 may include more than one operational amplifier. If voltage Vs is sinusoidal, then the change in the value of (r1*c1−r2*c2) can be measured using a synchronous demodulator. At steady state, the time derivative of Vs is only a function of time, and therefore there is a linear relationship between output Vd at a fixed time of a cycle of the output (e.g., at the peak of the cycle), the average absolute value of its positive and/or negative cycles, or the signal extracted from the output using synchronous demodulation (if output Vs of the voltage source G1 is sinusoidal), and the value (r1*c1−r2*c2). As a result, there is a linear relationship between output Vd at a fixed time of a cycle of the output, the average absolute value of its positive and/or negative cycles, or the signal extracted from the output using synchronous demodulation, and the capacitance c1 if capacitor C2 has a fixed capacitance, or the capacitance c2 if capacitor C1 has a fixed capacitance.

Figure 4B:
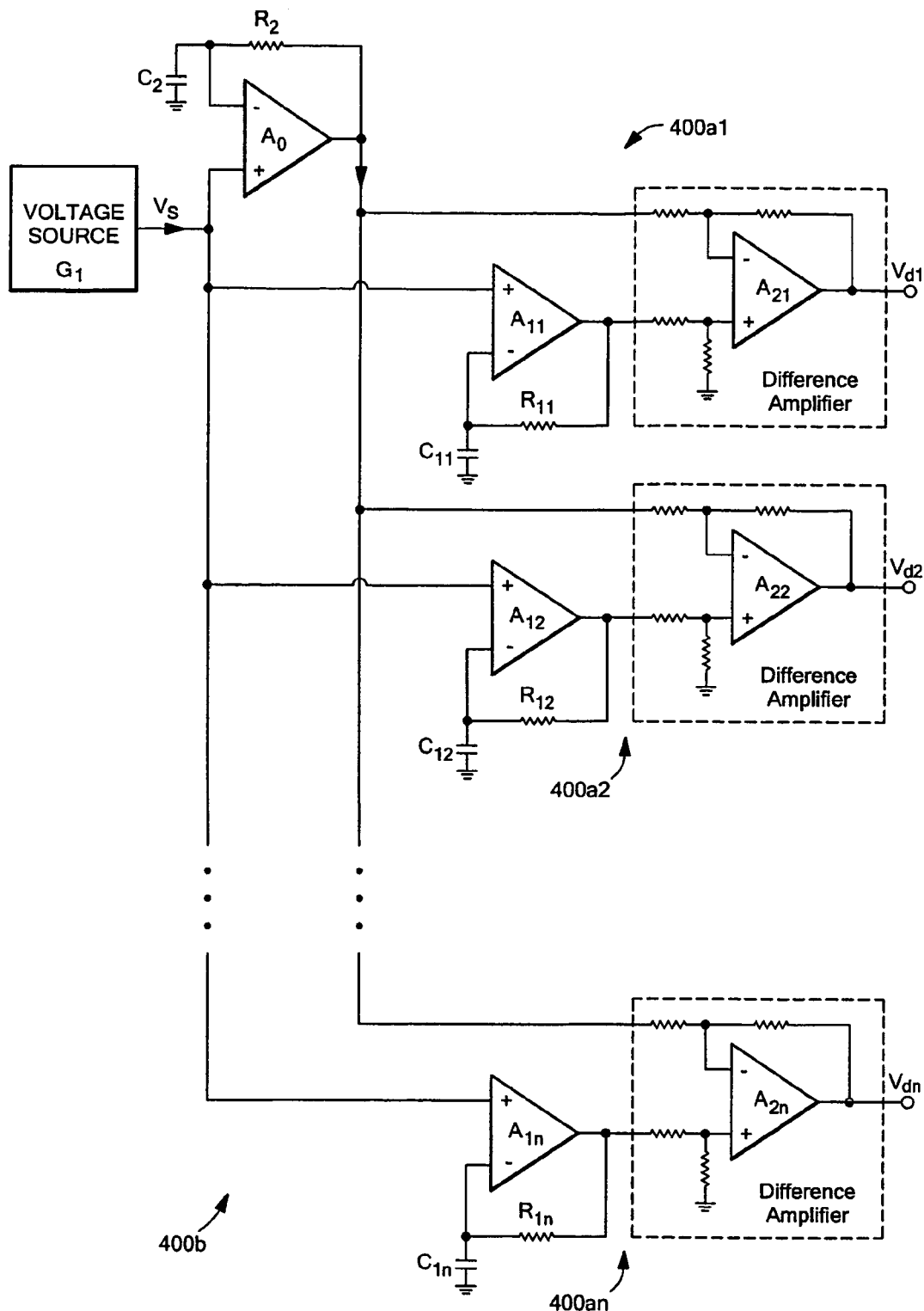
FIG. 4b is a schematic diagram of circuitry employing the third capacitance measurement circuitry of FIG. 4a, for producing a linear response to changes in each of the differences between the capacitance of a capacitor multiplied by a first constant factor and the capacitance of one or more other different capacitors, after each is multiplied by a respective second constant factor.

FIG. 4b depicts circuitry 400b employing capacitance measurement circuitry 400a1-400an to produce a linear response to changes in each of the differences between the capacitance of a capacitor/capacitive transducer multiplied by a first constant factor, and the capacitance of one or more other different capacitors/capacitive transducers after each is multiplied by a respective second constant factor, while keeping all of the capacitors/capacitive transducers at substantially identical voltage potentials at all times. Each of capacitors/capacitive transducers C11-C1n having capacitances of c11-c1n, respectively, is compared to the capacitance c2 of capacitor/capacitive transducer C2. Each of the capacitance measurement circuitry 400a1-400an in conjunction with operational amplifier A0 feedback resistor R2, and capacitor C2, operates like the capacitance measurement circuitry 400a (see FIG. 4a). There is therefore a linear relationship between each of outputs Vd1-Vdn at a fixed time of a cycle of the output (e.g., at the peak of the cycle), the average absolute value of its positive and/or negative cycles, or the signal extracted from the output using synchronous demodulation (if output Vs of the voltage source G1 is sinusoidal), and its respective value (r1n*c1n−r2*c2), in which "r1n" is the resistance of the respective feedback resistor R1n associated with the respective operational amplifier A1n. Accordingly, there is a linear relationship between each of outputs Vd1-Vdn at a fixed time of a cycle of the output, the average absolute value of its positive and/or negative cycles, or the signal extracted from the output using synchronous demodulation, and the capacitances c11-c1n, respectively, if capacitor C2 has a fixed capacitance.

By switching capacitors/capacitive transducers in and out for subsequent measurement, each embodiment of the presently disclosed capacitance measurement circuitry can sequentially produce linear responses to changes in the capacitance or the reciprocal of the capacitance of a large number of capacitors/capacitive transducers, or compare the capacitances of a large number of capacitors/capacitive transducers to the capacitances of a large number of sets of capacitors/capacitive transducers. It is noted that any suitable type of capacitive transducer may be employed in each embodiment of the capacitance measurement circuitry described above, including but not limited to any suitable type of capacitive transducer for sensing force, pressure, strain, acceleration, sound, mechanical displacement, fluid flow, etc. It is further noted that each embodiment of the capacitance measurement circuitry described above may employ any suitable type of double-ended power supply, or single-ended power supply, if an appropriate circuit ground reference can be provided e.g., by a voltage splitter circuit.

FIGS. 5a-5d depict illustrative embodiments of a front surface of a touchless switch, in accordance with the present invention. The front surface of the presently disclosed touchless switch can take the form of any suitable type of container such as containers 500a-500c depicted in FIGS. 5a-5c, respectively. As shown in FIGS. 5a-5c, each of the containers 500a-500c includes a base portion such as base portions 502a-502c of FIGS. 5a-5c, respectively, and a brim portion such as brim portions 504a-504c of FIGS. 5a-5c, respectively. Alternatively, the front surface of the switch can be flat like a front surface 500d (see FIG. 5d), or any other suitable surface configuration. The presently disclosed touchless switch includes two sensor electrodes, specifically, a center electrode and an outer electrode, which are disposed on or behind the front surface of the switch and are maintained at substantially the same voltage potential. The center electrode is spaced from and at least partly surrounded by the outer electrode. The center and outer electrodes can be of any suitable shape, form, or size, and need not be a solid piece, e.g., an electrode may be a wire mesh. FIGS. 6a-6d depict illustrative arrangements and positions of the center and outer electrodes relative to each other, and relative to the front surfaces 500a-500d of FIGS. 5a-5d, respectively. As shown in FIGS. 6a-6c, when the front surface is in the form of a container, the center electrode is disposed near the base of the container, and the outer electrode is disposed near the brim of the container.

The presence of the tip of a human finger or a finger-like object near or proximate to the center electrode of the touchless switch can be detected using an embodiment of the presently disclosed capacitance measurement circuitry. When detecting the presence of the human finger or finger-like object, the capacitance measurement circuitry compares the capacitances of the capacitors formed between the two sensor electrodes (i.e., the center electrode and the outer electrode) and the human finger or finger-like object, thereby substantially canceling out extraneous common-mode disturbances, for example, the capacitance between the rest of the human body and the sensor electrodes, the capacitance between the human body and ground, environmental changes, electrical noise, etc. Such extraneous common-mode disturbances tend to affect both sensor electrodes equally due to their close proximity to one another. Additionally, the outer electrode can be positioned in the touchless switch so that the tip of the human finger or finger-like object is required to go past a specified boundary before actuating the switch. In one embodiment, this is accomplished by positioning the outer electrode a specified distance in front of the center electrode, and configuring the spacing between the two sensor electrodes and their relative surface areas so that when an object is near the electrodes, but more than a specified distance away from the center electrode, the ratio of the capacitance between the object and the center electrode to the capacitance between the object and the outer electrode, or the difference between the capacitance between the object and the center electrode multiplied by a first constant and the capacitance between the object and the outer electrode multiplied by a second constant, is less than a preset threshold. It is understood that the capacitance ratio and difference measurements are performed by an embodiment of the above-described capacitance measurement circuitry, and are facilitated by the fixed geometrical shape, size, and relative position of the two sensor electrodes. In one embodiment, the touchless switch is actuated when the measured capacitance ratio or difference exceeds the preset threshold.

Accordingly, the touchless switch is not actuated by a human finger or finger-like object until the finger passes through the specified boundary. In the event the front surface of the touchless switch has the form of the surface of a container (see, e.g., FIGS. 5a-5c), the specified boundary coincides with an imaginary plane defined by the brim of the container. As the tip of a human finger or finger-like object moves toward the center electrode and breaks the plane of the specified boundary, the capacitance associated with the center electrode increases more rapidly than the capacitance associated with the outer electrode. The touchless switch is actuated when the ratio of the capacitances associated with the center electrode and the outer electrode, or the difference between the capacitance associated with the center electrode multiplied by a first constant and the capacitance associated with the outer electrode multiplied by a second constant, exceeds the preset threshold.

Figure 7:
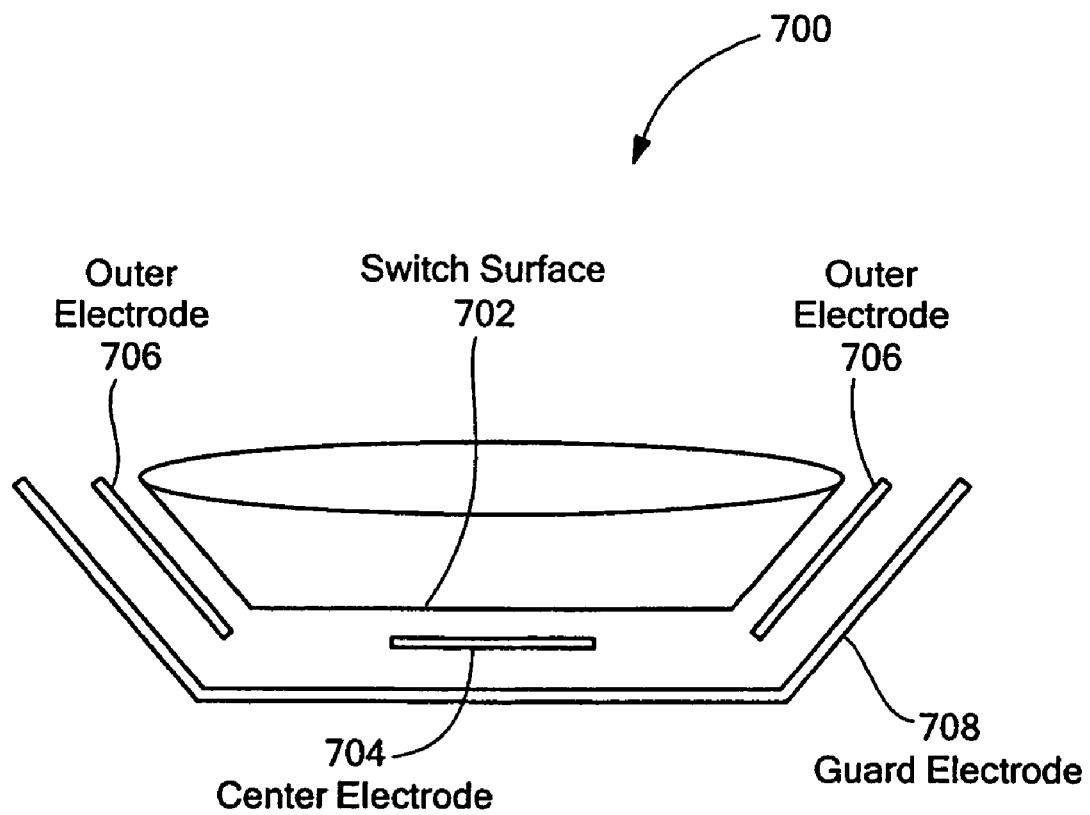
FIG. 7 is a cross-sectional view of an illustrative arrangement and relative positions of two sensor electrodes, a front surface, and a guard electrode of a touchless switch according to the present invention.

FIG. 7 depicts an illustrative embodiment of a touchless switch 700, in accordance with the present invention. In the illustrated embodiment, the touchless switch 700 includes a front surface 702 in the form of a container, a center electrode 704, an outer electrode 706, and a guard electrode 708 surrounding the back and the sides of the two sensor electrodes 704, 706. All of the electrodes 704, 706, 708 are maintained at substantially the same voltage potential. As a result, the two sensor electrodes 704, 706 are operative to form electric fields only between the sensor electrodes and objects disposed in front of the switch, i.e., above the switch 700, as depicted in FIG. 7. Leads extending from the two sensor electrodes to the capacitance measurement circuitry may also be guarded using a twin-axial cable or two coaxial cables, in which the outer conductors of the cables are employed as guard shields and maintained at substantially the same voltage potential as the inside cable conductors connected to the sensor electrodes.

Figure 8A:
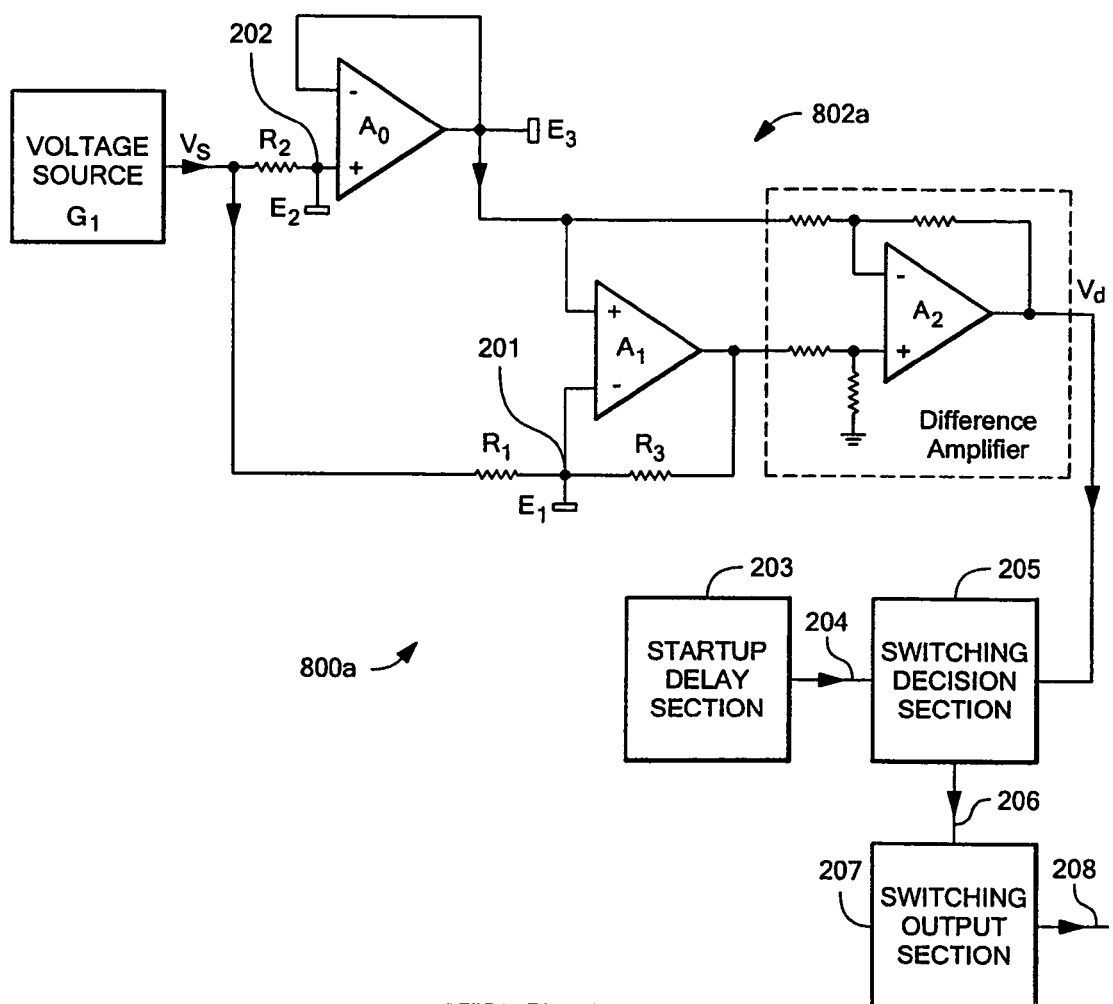

FIG. 8a depicts a first illustrative circuit implementation 800a of a touchless switch, in accordance with the present invention. As shown in FIG. 8a, the circuit implementation 800a comprises a center electrode E1, an outer electrode E2, a guard electrode E3, a startup delay section 203, a switching decision section 205, a switching output section 207, and capacitance measurement circuitry 802a, which includes a periodic varying voltage source G1, operational amplifiers A0 and A1, resistors R1-R3, and an operational amplifier A2 configured as a difference amplifier. The center electrode E1 is connected to the inverting input of operational amplifier A1 at node 201, and the outer electrode E2 is connected at node 202 to the non-inverting input of operational amplifier A0, which is configured as a voltage follower to provide the voltage potential of outer electrode E2 to the non-inverting input of operational amplifier A1. The nodes 201 and 202 are both driven by an output Vs of the periodic varying voltage source G1. Electrodes E1 and E2 correspond to capacitors C1 and C2 of FIG. 2a, respectively. Guard electrode E3 is connected to the output of operational amplifier A0, and therefore the voltage potential of guard electrode E3 is substantially equal to the voltage potentials of sensor electrodes E1 and E2. Guard electrode E3 may be configured to surround the back and the sides of sensor electrodes E1 and E2 so that capacitances can only be formed between conductive objects disposed in front of the touchless switch and sensor electrodes E1 and E2. It is noted that operational amplifiers A1 and A2 of FIG. 8a are like operational amplifiers A1 and A2 of FIG. 2a, respectively, resistor R2 of FIG. 8a is like resistor R2 of FIG. 2a, resistors R1 and R3 of FIG. 8a are like resistors R1 and R3 of FIG. 2a, respectively, and the periodic varying voltage source G1 of FIG. 8a is like the periodic varying voltage source G1 of FIG. 2a. Thus, there is a linear relationship between output Vd of difference amplifier A2 at a fixed time of a cycle of the output (e.g., at the peak of the cycle), or the average absolute value of its positive and/or negative cycles, or the signal extracted from the output using synchronous demodulation (if output Vs of voltage source G1 is sinusoidal), and the ratio of the capacitance associated with center electrode E1 to the capacitance associated with outer electrode E2. Difference amplifier A2 provides output Vd to the switching decision section 205, which determines whether to actuate the touchless switch based on signal Vd. For example, the switching decision section 205 can base its decision on the phase, the amplitude, an average, and/or any other suitable property of signal Vd. Alternatively, the switching decision section 205 can require a specified number of consecutive detections of the required phase and/or amplitude of signal Vd, or the satisfaction of certain criteria, before deciding to actuate the touchless switch. If voltage Vs is sinusoidal, then a synchronous demodulator can be included in the switching decision section 205 so that the change in the ratio of the capacitance associated with center electrode E1 to the capacitance associated with outer electrode E2 can be obtained with a high degree of accuracy, even at a high noise level. It should be noted that the switching decision section 205 may require one or more signals in addition to signal Vd to determine whether or not to actuate the switch. For example, the switching decision section 205 may require a reference signal to determine the phase of signal Vd. The switching decision section 205 provides a logic signal 206 representing its decision to the switching output section 207, which implements the required switching action. It is noted that the switching output section 207 may be implemented using any suitable number of logical outputs (normally high or low), solid state switch outputs, and/or dry contact outputs (normally open or closed) in any suitable switching mode, including but not limited to pulse mode, momentarily mode, toggle mode, etc. The switching output section 207 can also be configured to produce audio and/or visual outputs to indicate the status of the touchless switch. Because the capacitance measurement circuitry 802a takes several cycles of output Vs of the voltage source G1 to stabilize, the startup delay section 203 outputs a startup signal 204 to the switching decision section 205 during the startup period to prevent the switching decision section 205 from inadvertently actuating the switch. When sensor electrodes E1 and E2 are disposed at a distance away from the inputs of operational amplifiers A0 and A1, the leads from center electrode E1 and outer electrode E2 may be guarded using a twin-axial cable or two coaxial cables of equal length, using the outer conductors as the guard shields connected to guard electrode E3 and maintained at substantially the same voltage potential as the inside conductors connected to respective sensor electrodes E1 and E2, so that no stray capacitance is introduced and any other unwanted effects introduced by the leads are substantially cancelled out.

Figure 8B:
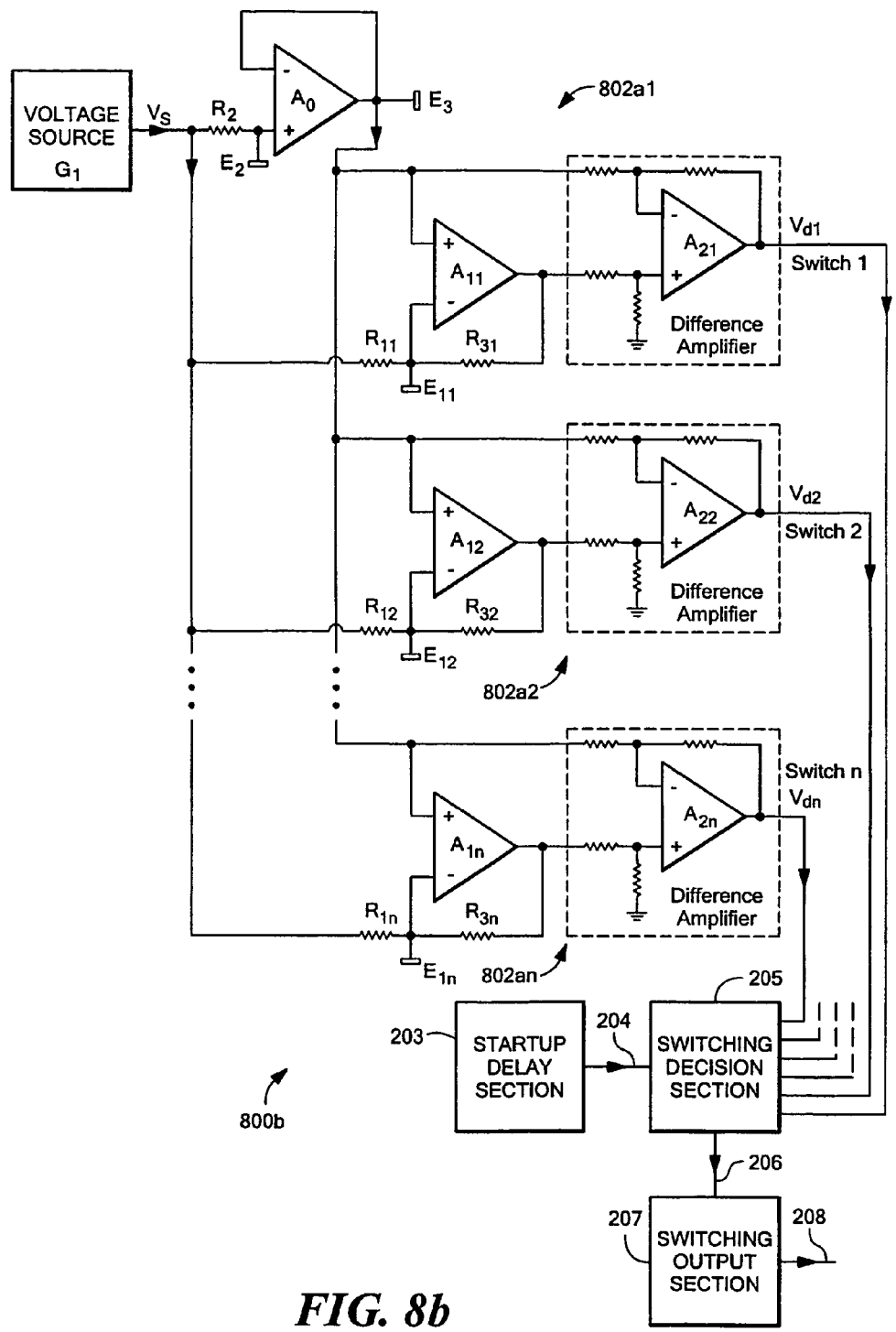

FIG. 8b depicts a first illustrative circuit implementation 800b of a set of touchless switches, including a periodic varying voltage source G1, an operational amplifier A0, capacitance measurement circuitry 802a1-802an, the startup delay section 203, the switching decision section 205, and the switching output section 207. It is noted that each of the capacitance measurement circuitry 802a1-802an in conjunction with operational amplifier A0 is like the capacitance measurement circuitry 802a (see FIG. 8a), and corresponds to a respective touchless switch in the set of touchless switches. Specifically, electrode E2 coupled to the non-inverting input of operational amplifier A0 corresponds to a common outer electrode of the set of touchless switches, and electrode E3 coupled to the output of operational amplifier A0 corresponds to a common guard electrode of the set of touchless switches. Each of electrodes E11-E1n corresponds to a center electrode of a respective touchless switch. It is noted that operational amplifier A0 of FIG. 8b is like operational amplifier A0 of FIG. 2b, operational amplifiers A11-A1n of FIG. 8b are like operational amplifiers A11-A1n of FIG. 2b, respectively, difference amplifiers A21-A2n of FIG. 8b are like difference amplifiers A21-A2n of FIG. 2b, respectively, resistor R2 of FIG. 8b is like resistor R2 of FIG. 2b, resistors R11-R1n of FIG. 8b are like resistors R11-R1n of FIG. 2b, respectively, resistors R31-R3n of FIG. 8b are like resistors R31-R3n of FIG. 2b, respectively, and the periodic varying voltage source G1 of FIG. 8b is like the periodic varying voltage source G1 of FIG. 2b. Difference amplifiers A21-A2n provide output signals Vd1-Vdn, respectively, to the switching decision section 205, which determines when to actuate each switch based on the respective signals Vd1-Vdn. The switching decision section 205 provides logic signals 206 representing its respective decisions to the switching output section 207, which implements the required switching action for each switch. It is noted that the switching output section 207 may be implemented using any suitable number of logical outputs (normally high or low), solid state switch outputs, and/or dry contact outputs (normally open or closed) in any suitable switching mode, including but not limited to pulse mode, momentarily mode, toggle mode, etc., for each switch. The switching output section 207 can also be configured to produce audio and/or visual outputs to indicate the status of each switch. The startup delay section 203 of FIG. 8b is like the corresponding section 203 described above with reference to FIG. 8a, and each switch of circuit implementation 800b (see FIG. 8b) basically operates like the switch of circuit implementation 800a (see FIG. 8a).

Figure 9A:
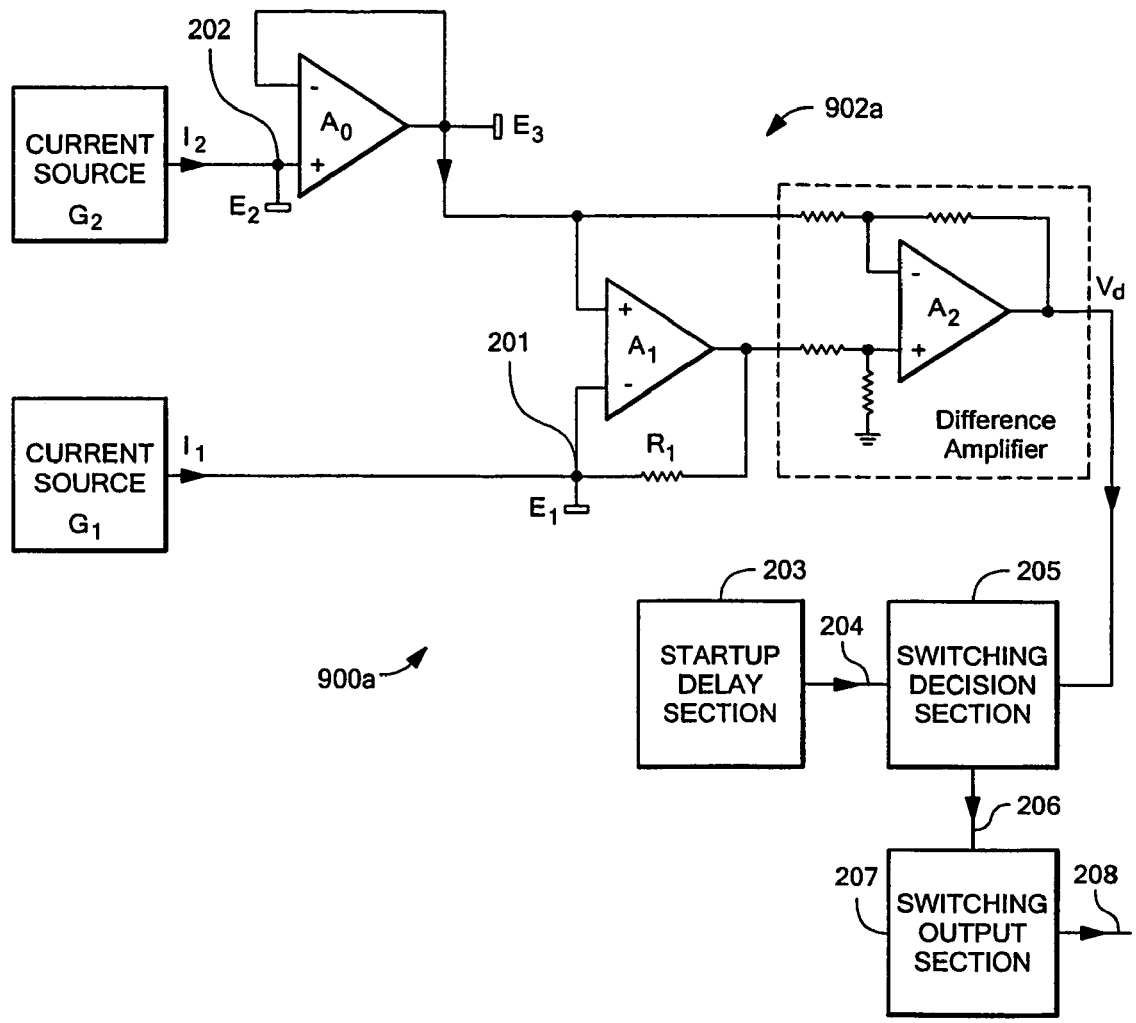

FIG. 9a depicts a second illustrative circuit implementation 900a of a touchless switch, in accordance with the present invention. As shown in FIG. 9a, the circuit implementation 900a comprises a center electrode E1, an outer electrode E2, a guard electrode E3, a startup delay section 203, a switching decision section 205, a switching output section 207, and capacitance measurement circuitry 902a, which includes periodic varying current sources G1 and G2, operational amplifiers A0 and A1, resistor R1, and an operational amplifier A2 configured as a difference amplifier. The center electrode E1 is connected to the inverting input of operational amplifier A1 at node 201, and outer electrode E2 is connected at node 202 to the non-inverting input of operational amplifier A0, which is configured as a voltage follower to provide the voltage potential of outer electrode E2 to the non-inverting input of operational amplifier A1. The node 201 is driven by an output current I1 of the periodic varying current source G1 and node 202 is driven by an output current I2 of the periodic varying current source G2. Electrodes E1 and E2 correspond to capacitors C1 and C2 of FIG. 3a, respectively. Guard electrode E3 is connected to the output of operational amplifier A0, and therefore the voltage potential of guard electrode E3 is substantially the same as the voltage potentials of sensor electrodes E1 and E2. Guard electrode E3 may be configured to surround the back and the sides of sensor electrodes E1 and E2 so that capacitances can be formed only between conductive objects disposed in front of the touchless switch and the sensor electrodes E1 and E2. It is noted that operational amplifiers A1 and A2 of FIG. 9a are like operational amplifiers A1 and A2 of FIG. 3a, respectively, resistor R1 of FIG. 9a is like resistor R1 of FIG. 3a, and the periodic varying current sources G1 and G2 of FIG. 9a are like the periodic varying current sources G1 and G2 of FIG. 3a, respectively. Thus, there is a linear relationship between output Vd of difference amplifier A2 at a fixed time of a cycle of the output (e.g., at the peak of the output), or the average absolute value of its positive and/or negative cycles, or the signal extracted from the output using synchronous demodulation (if output I2 of current source G2 is sinusoidal), and the ratio of the capacitance associated with center electrode E1 to the capacitance associated with outer electrode E2. Difference amplifier A2 provides output signal Vd to the switching decision section 205, which determines whether to actuate the touchless switch based on signal Vd. For example, the switching decision section 205 can base its decision on the phase, the amplitude, an average, and/or any other suitable property of signal Vd. Alternatively, the switching decision section 205 can require a specified number of consecutive detections of the required phase and/or amplitude of signal Vd, or the satisfaction of certain criteria, before deciding to actuate the switch. If current I2 is sinusoidal, then a synchronous demodulator can be included in the switching decision section 205 so that the change in the ratio of the capacitance associated with center electrode E1 to the capacitance associated with outer electrode E2 can be obtained with a high degree of accuracy, even at a high noise level. It should be noted that the switching decision section 205 may require one or more signals in addition to signal Vd to determine whether or not to actuate the switch. For example, the switching decision section 205 may require a reference signal to determine the phase of signal Vd. The switching decision section 205 provides a logic signal 206 representing its decision to the switching output section 207, which implements the required switching action. It is noted that the switching output section 207 may be implemented using any suitable number of logical outputs (normally high or low), solid state switch outputs, and/or dry contact outputs (normally open or closed) in any switching mode, including but not limited to pulse mode, momentarily mode, toggle mode, etc. The switching output section 207 can also be configured to produce audio and/or visual outputs to indicate the status of the switch. Because the capacitance measuring circuitry 902a takes several cycles of the output I2 of the periodic varying current source G2 to stabilize, a startup delay section 203 provides a startup signal 204 to the switching decision section 205 during the startup period to prevent it from inadvertently actuating the switch. When sensor electrodes E1 and E2 are disposed at a distance away from the inputs of operational amplifiers A0 and A1, the leads from sensor electrodes E1 and E2 may be guarded using a twin-axial cable or two coaxial cables of equal length, with the outer conductors employed as guard shields connected to guard electrode E3 and maintained at substantially the same voltage potential as the inside conductors connected to respective sensor electrodes E1 and E2, so that no stray capacitance is introduced and any other unwanted effects introduced by the leads are substantially cancelled out.

Figure 9B:
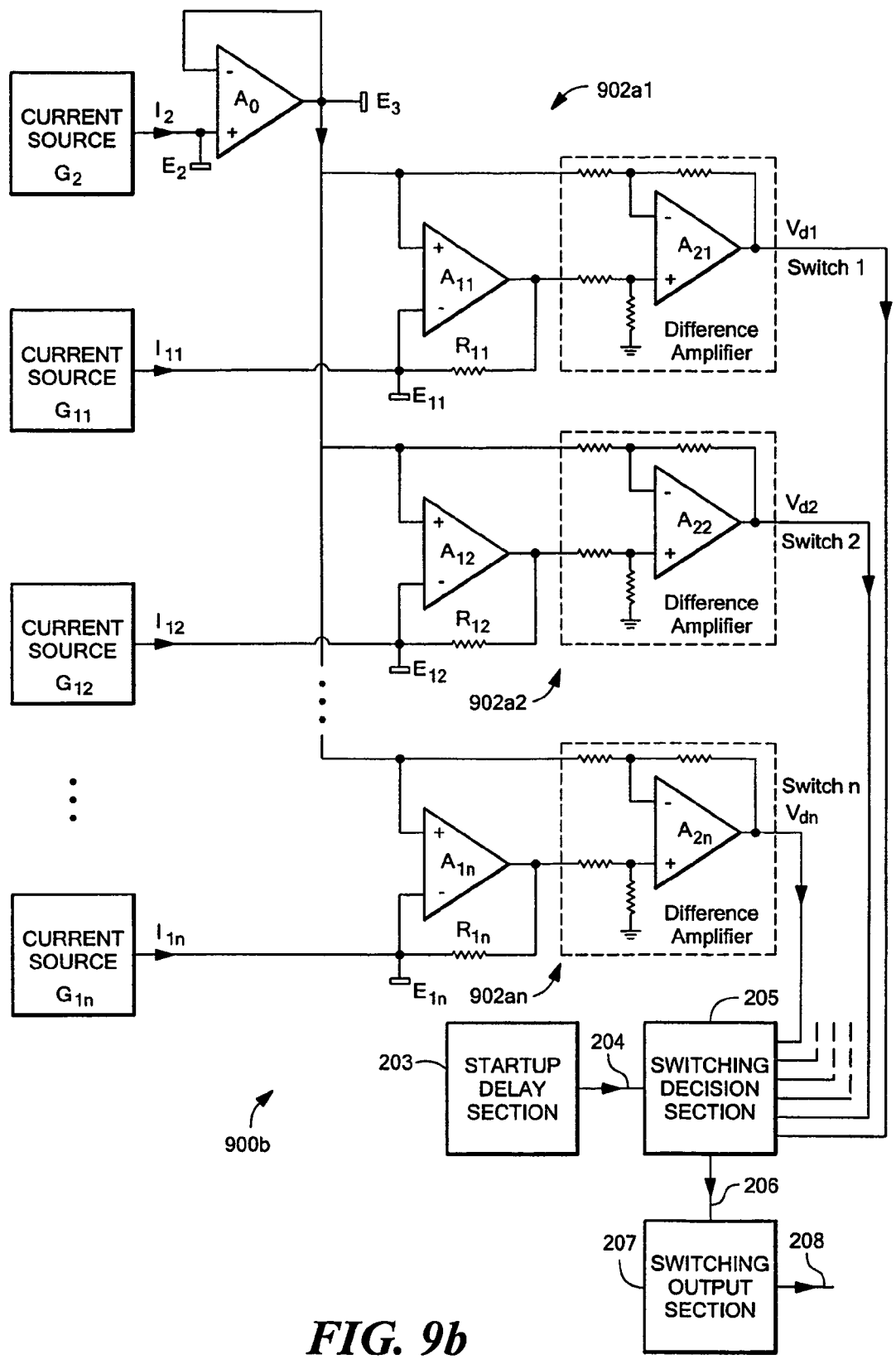

FIG. 9b depicts a second illustrative circuit implementation 900b of a set of touchless switches, including periodic varying current sources G11-G1n, a periodic varying current source G2, an operational amplifier A0, capacitance measurement circuitry 902a1-902an, the startup delay section 203, the switching decision section 205, and the switching output section 207. It is noted that each of the capacitance measurement circuitry 902a1-902an, in conjunction with operational amplifier A0, is like the capacitance measurement circuitry 902a (see FIG. 9a), and corresponds to a respective touchless switch in the set of touchless switches. Specifically, electrode E2 coupled to the non-inverting input of operational amplifier A0 corresponds to a common outer electrode of the set of touchless switches, and electrode E3 coupled to the output of operational amplifier A0 corresponds to a common guard electrode of the set of touchless switches. Each of electrodes E11-E1n corresponds to a center electrode of a respective touchless switch. Further, operational amplifier A0 of FIG. 9b is like operational amplifier A0 of FIG. 3b, operational amplifiers A11-A1n of FIG. 9b are like operational amplifiers A11-A1n of FIG. 3b, respectively, difference amplifiers A21-A2n of FIG. 9b are like difference amplifiers A21-A2n of FIG. 3b, respectively, resistors R11-R1n of FIG. 9b are like resistors R11-R1n of FIG. 3b, respectively, the periodic varying current source G2 of FIG. 9b is like the periodic varying current source G2 of FIG. 3b, and the periodic varying current sources G11-G1n of FIG. 9b are like the periodic varying current sources G11-G1n of FIG. 3b. Difference amplifiers A21-A2n provide output signals Vd1-Vdn, respectively, to the switching decision section 205, which determines when to actuate each switch based on the respective signals Vd1-Vdn. The switching decision section 205 provides logic signals 206 representing its respective decisions to the switching output section 207, which implements the required switching action for each switch. It is noted that the switching output section 207 may be implemented using any suitable number of logical outputs (normally high or low), solid state switch outputs, and/or dry contact outputs (normally open or closed) in any suitable switching mode, including but not limited to pulse mode, momentarily mode, toggle mode, etc., for each switch. The switching output section 207 can also be configured to produce audio and/or visual outputs to indicate the status of each switch. The startup delay section 203 of FIG. 9b is like the startup delay section 203 of FIG. 9a, and each switch of circuit implementation 900b (see FIG. 9b) basically operates like the switch of circuit implementation 900a (see FIG. 9a).

Figure 10A:
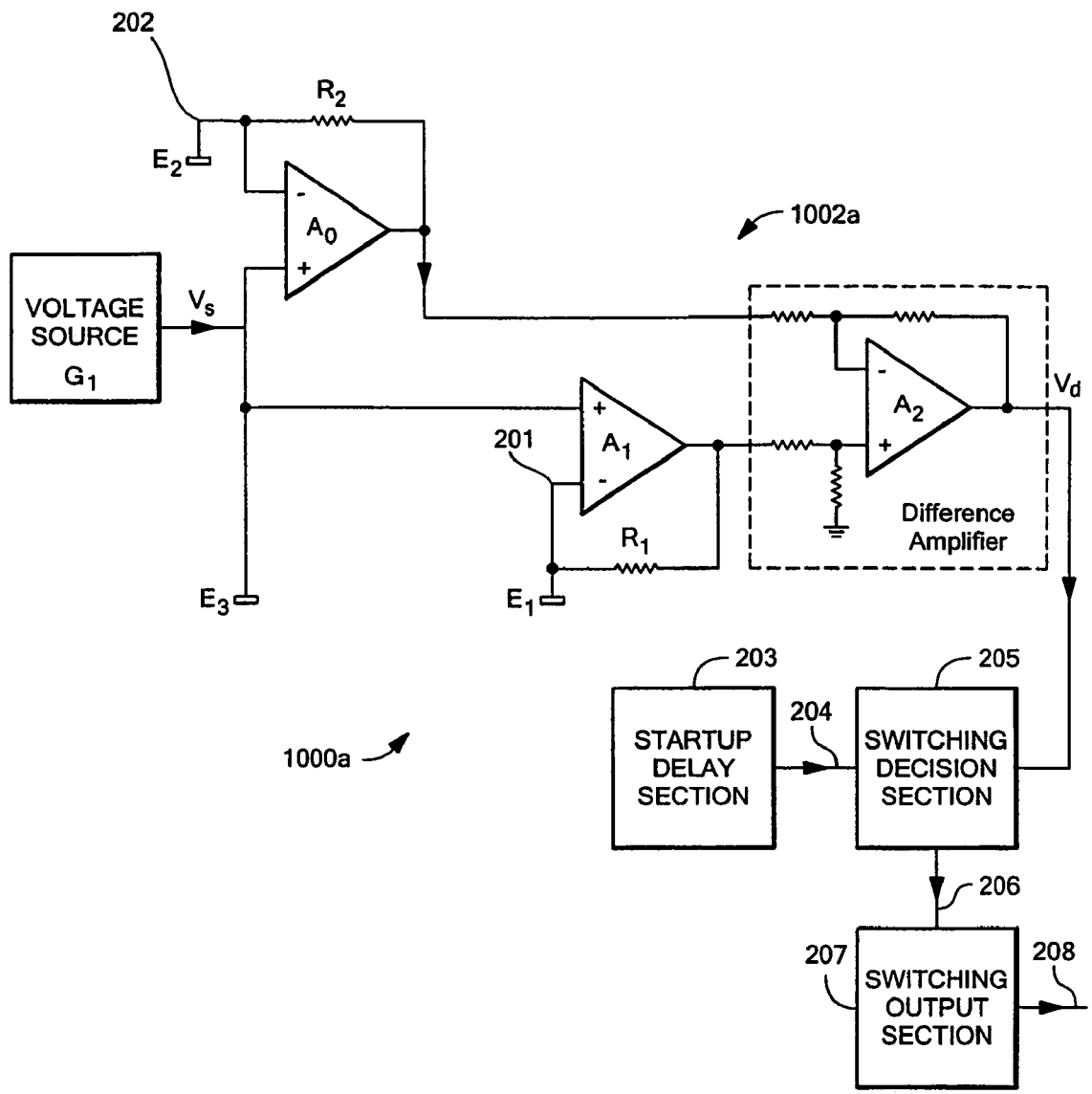

FIG. 10a depicts a third illustrative circuit implementation 1000a of a touchless switch, in accordance with the present invention. As shown in FIG. 10a, the circuit implementation 1000a comprises a center electrode E1, an outer electrode E2, a guard electrode E3, a startup delay section 203, a switching decision section 205, a switching output section 207, and capacitance measurement circuitry 1002a, which includes a periodic varying voltage source G1, operational amplifiers A0 and A1, resistors R1 and R2, and an operational amplifier A2 configured as a difference amplifier. The non-inverting inputs of operational amplifier A0 and A1 are both driven by an output Vs of the periodic varying voltage source G1. The center electrode E1 is connected to the inverting input of operational amplifier A1 at node 201, and outer electrode E2 is connected at node 202 to the inverting input of operational amplifier A0. It is noted that sensor electrodes E1 and E2 correspond to capacitors C1 and C2 of FIG. 4a, respectively. Guard electrode E3 is connected to the output of the periodic varying voltage source G1, and is therefore substantially the same as the voltage potential of the two sensor electrodes E1 and E2. Guard electrode E3 may be configured to surround the back and the sides of the sensor electrodes E1 and E2 so that capacitances can be formed only between conductive objects disposed in front of the touchless switch and the sensor electrodes E1 and E2. It is noted that operational amplifiers A0 and A1 of FIG. 10a are like operational amplifiers A0 and A1 of FIG. 4a, respectively, resistor R1 of FIG. 10a is like resistor R1 of FIG. 4a, resistor R2 of FIG. 10a is like resistor R2 of FIG. 4a, and the periodic varying voltage source G1 of FIG. 10a is like the periodic varying voltage source G1 of FIG. 4a. Thus, there is a linear relationship between output Vd of difference amplifier A2 at a fixed time of a cycle of the output (e.g., at the peak of the cycle), or the average absolute value of its positive and/or negative cycles, or the signal extracted from the output using synchronous demodulation (if output Vs of the voltage source G1 is sinusoidal) and the value $(r1*c1-r2*c2)$, in which $r1$ and $r2$ are the respective resistances of resistors R1 and R2 and $c1$ and $c2$ are the respective capacitances associated with sensor electrodes E1 and E2. The difference amplifier A2 provides output signal Vd to the switching decision section 205, which determines whether to actuate the switch based on signal Vd. For example, the switching decision section 205 can base its decision on the phase, the amplitude, an average, and/or any other suitable property of signal Vd. Alternatively, the switching decision section 205 can require a specified number of consecutive detections of the required phase and/or amplitude of signal Vd, or the satisfaction of certain criteria, before deciding to actuate the switch. If voltage Vs is sinusoidal, then a synchronous demodulator can be included in the switching decision section 205 so that the change in the value of $(r1*c1-r2*c2)$ can be obtained with a high degree of accuracy, even at a high noise level. It should be noted that the switching decision section 205 may require one or more signals in addition to signal Vd to determine whether or not to actuate the switch. For example, the switching decision section 205 may require a reference signal to determine the phase of output signal Vd. The switching decision section 205 provides a logic signal 206 representing its decision to the switching output section 207, which implements the required switching action. It is noted that the switching output section 207 may be implemented using any suitable number of logical outputs (normally high or low), solid state switch outputs, and/or dry contact outputs (normally open or closed) in any switching mode, including but not limited to pulse mode, momentarily mode, toggle mode, etc. The switching output section 207 can also be configured to produce audio and/or visual outputs to indicate the status of the switch. Because the capacitance measuring circuit 1002a takes several cycles of output Vs of the periodic varying voltage source G1 to stabilize, a startup delay section 203 provides a startup signal 204 to the switching decision section 205 during the startup period to prevent it from inadvertently actuating the switch. When sensor electrodes E1 and E2 are disposed at a distance away from the inputs of operational amplifiers A0 and A1, the leads from sensor electrodes E1 and E2 may be guarded using a twin-axial cable or two coaxial cables of equal length, with the outer conductors employed as guard shields connected to the guard electrode E3 and maintained at substantially the same voltage potential as the inside conductors connected to respective sensor electrodes E1 and E2, so that no stray capacitance is introduced and any other unwanted effects introduced by the leads are substantially cancelled out.

Figure 10B:
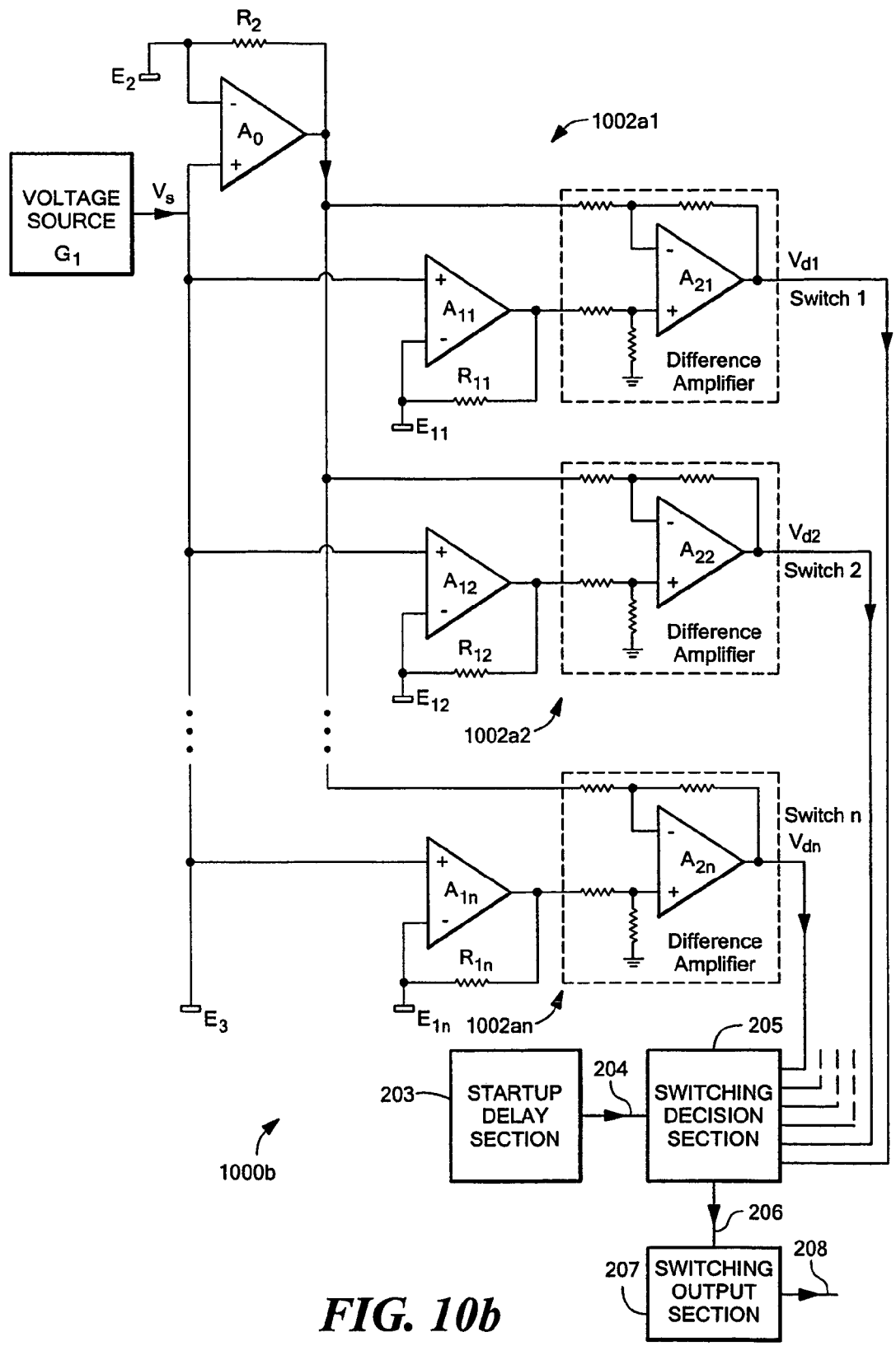

FIG. 10b depicts a third illustrative circuit implementation 1000b of a set of touchless switches, including a periodic varying voltage source G1, an operational amplifier A0, capacitance measurement circuitry 1002a1-1002an, the startup delay section 203, the switching decision section 205, and the switching output section 207. It is noted that each of the capacitance measurement circuitry 1002a1-1002an, in conjunction with operational amplifier A0, is like the capacitance measurement circuitry 1002a (see FIG. 10a), and corresponds to a respective touchless switch in the set of touchless switches. Specifically, electrode E2 coupled to the inverting input of operational amplifier A0 corresponds to a common outer electrode of the set of touchless switches, and electrode E3 coupled to the output Vs of voltage source G1 corresponds to a common guard electrode of the set of touchless switches. Each of electrodes E11-E1n corresponds to a center electrode of a respective touchless switch. Further, operational amplifier A0 of FIG. 10b is like operational amplifier A0 of FIG. 4b, operational amplifiers A11-A1n of FIG. 10b are like operational amplifiers A11-A1n of FIG. 4b, respectively, difference amplifiers A21-A2n of FIG. 10b are like difference amplifiers A21-A2n of FIG. 4b, respectively, resistor R2 of FIG. 10b is like resistor R2 of FIG. 4b, resistors R11-R1n of FIG. 10b are like resistors R11-R1n of FIG. 4b, respectively, and the periodic varying voltage source G1 of FIG. 10b is like the periodic varying voltage source G1 of FIG. 4b. The difference amplifiers A21-A2n provide output signals Vd1-Vdn, respectively, to the switching decision section 205, which determines when to actuate each switch based on the respective signals Vd1-Vdn. The switching decision section 205 provides logic signals 206 representing its respective decisions to the switching output section 207, which implements the required switching action for each switch. It is noted that the switching output section 207 may be implemented using any suitable number of logical outputs (normally high or low), solid state switch outputs, and/or dry contact outputs (normally open or closed) in any suitable switching mode, including but not limited to pulse mode, momentarily mode, toggle mode, etc., for each switch. The switching output section 207 can also be configured to produce audio and/or visual outputs to indicate the status of each switch. The startup delay section 203 of FIG. 10b is like the startup delay section 203 of FIG. 10a, and each switch of circuit implementation 1000b (see FIG. 10b) operates like the switch of circuit implementation 1000a (see FIG. 10a).

Having described the above illustrative embodiments, other alternative embodiments or variations may be made. For example, each of the presently disclosed circuit implementations of touchless switches can be scaled up to detect the proximity of a larger human appendage or other conductive object, e.g., the palm of a human hand. The above illustrative embodiments can also be adapted to detect the position or movement of a human appendage or conductive object by measuring the capacitances between the object and each of an array of sensor electrodes, using one of the capacitance measuring techniques described above and analyzing the results using suitable electronic circuitry or a suitably programmed computer.

It is noted that the outer electrode of the touchless switch may be positioned in front of, behind, or at any other suitable position relative to the center electrode or set of center electrodes, depending upon the specific application. Also, as discussed above, the electrodes can be of any suitable shape, form, or size, and need not be a solid piece. For example, in an application for a proximity sensor in which the sensor is used in an outdoor environment, the proximity sensor can have an outer electrode in the form of an insulated conductive mesh disposed on the outer surface of the proximity sensor, and a center electrode placed behind the outer electrode on the inner side of the surface of the proximity sensor. In such an application, the presence of a human appendage or other conductive object near or proximate to the proximity sensor in front of the center electrode causes the capacitance associated with the center electrode to increase more than the capacitance associated with the outer electrode. The condition in which the relative changes in the capacitance associated with the center electrode and the capacitance associated with the outer electrode exceed a preset threshold can then be detected using one of the above-described embodiments of the capacitance measurement circuitry. When water or moisture is deposited on the outer surface of the proximity sensor, it is essentially deposited on the insulated conductive mesh of the outer electrode. As a result, the water or moisture has a greater effect on the capacitance associated with the outer electrode than the capacitance associated with the center electrode for the same amount of surface area due to fact that it is much closer to the outer electrode, being separated by just the thickness of the insulation of the outer electrode. Since the outer electrode is in the form of a mesh, the surface area of the outer electrode in contact with the water or moisture is usually much smaller than the area projected onto the surface of the center electrode by the water or moisture. By properly designing the relative sizes of the surface areas and the spacing between the two electrodes of the proximity sensor, the relative changes in the capacitance associated with the two electrodes due to the presence of water or moisture on the surface of the proximity sensor can be made never to exceed the preset threshold, thereby enabling the proximity sensor to operate outdoors under inclement weather conditions. It is possible to have the insulated conductive mesh of the outer electrode reside in grooved or recessed areas of the surface of the proximity sensor so that the insulated conductive mesh can come in contact with water or moisture deposited on the surface of the proximity sensor, but not a human appendage or other conductive object near the proximity sensor. In this way, the relative changes in the capacitance associated with the two electrodes due to a human appendage or conductive object touching the surface of the proximity sensor can be made to exceed the preset threshold, while the mere presence of water or moisture on the surface of the proximity sensor does not cause the relative changes in capacitance to exceed the preset threshold.

In addition, while the present invention may be embodied using hardware components, it is appreciated that one or more functions necessary to implement the invention may alternatively be embodied in whole or in part using hardware or software or some combination thereof using micro-controllers, microprocessors, digital signal processors, programmable logic arrays, or any other suitable hardware and/or software.

It will be appreciated by those of ordinary skill in the art that further modifications to and variations of the above-described linear capacitance measurement and touchless switch may be made without departing from the inventive concepts disclosed herein. Accordingly, the invention should not be viewed as limited except as by the scope and spirit of the appended claims.

What is claimed is:

1. A capacitive sensing apparatus for generating at least one logical signal in response to a proximity of a conductive object, the capacitive sensing apparatus comprising:
   at least one first sensor electrode, a first capacitance being induced by the conductive object in proximity with the at least one first sensor electrode;
   a second sensor electrode disposed near the at least one first sensor electrode, a second capacitance being induced by the conductive object in proximity with the second sensor electrode; and
   an apparatus configured to maintain the at least one first sensor electrode and the second sensor electrode at substantially equal voltage potentials with respect to a common ground, and to measure relative changes in the first capacitance with respect to the second capacitance,
   wherein the at least one logical signal is indicative of a status condition in which the relative changes in the first and second capacitances exceed at least one preset threshold.

2. The capacitive sensing apparatus of claim 1 wherein the at least one first sensor electrode and the second sensor electrode are each disposed on one of two sides of a surface,
   wherein the surface contains at least one depressed area, each depressed area in a form of a container having a base and a brim,
   wherein the at least one first sensor electrode is disposed near the base of a corresponding container of the at least one depressed area, and
   wherein the second sensor electrode is disposed near the brim of each container.

3. The capacitive sensing apparatus of claim 1 further comprising a guard electrode, wherein the guard electrode is electrically isolated from the at least one first sensor electrode and the second sensor electrode,
   wherein the guard electrode is maintained at substantially the same voltage potential as the at least one first sensor electrode and the second sensor electrode, and
   wherein the guard electrode is configured to at least partly surround the at least one first sensor electrode and the second sensor electrode.

4. The capacitive sensing apparatus of claim 1 wherein the second sensor electrode is a conductive mesh and is disposed in front of the at least one first sensor electrode.

* * * * *